US009041450B2

United States Patent
Salling

(10) Patent No.: US 9,041,450 B2
(45) Date of Patent: May 26, 2015

(54) LOW-POWER DUAL-EDGE-TRIGGERED STORAGE CELL WITH SCAN TEST SUPPORT AND CLOCK GATING CIRCUIT THEREFORE

(71) Applicant: Oticon A/S, Smorum (DK)

(72) Inventor: Jakob Salling, Smorum (DK)

(73) Assignee: Oticon A/S, Smorum (DK)

( * ) Notice: Subject to any disclaimer, the term of this patent is extended or adjusted under 35 U.S.C. 154(b) by 0 days.

(21) Appl. No.: 14/170,980

(22) Filed: Feb. 3, 2014

(65) Prior Publication Data

US 2014/0145761 A1 May 29, 2014

Related U.S. Application Data

(62) Division of application No. 13/203,792, filed as application No. PCT/EP2010/053293 on Mar. 15, 2010, now Pat. No. 8,786,344.

(30) Foreign Application Priority Data

Mar. 23, 2009 (DK) .................................. 200900399
May 18, 2009 (EP) ..................................... 09160511

(51) Int. Cl.
*H03K 3/00* (2006.01)
*H03K 19/00* (2006.01)
(Continued)

(52) U.S. Cl.
CPC ............ *H03K 19/0013* (2013.01); *H03K 3/012* (2013.01); *H03K 3/037* (2013.01)

(58) Field of Classification Search
USPC ......... 327/161, 185, 199–203, 208–212, 214, 327/215, 218
See application file for complete search history.

(56) References Cited

U.S. PATENT DOCUMENTS

| | | |
|---|---|---|
| 5,289,518 A | 2/1994 | Nakao |
| 5,498,988 A | 3/1996 | Reyes et al. |

(Continued)

FOREIGN PATENT DOCUMENTS

| | | |
|---|---|---|
| EP | 1 940 027 A2 | 7/2008 |
| JP | 63-65711 A | 3/1988 |

OTHER PUBLICATIONS

Chung "The Usage of Dual Edge Triggered Flip-Flops in Low Power, Low Voltage Applications", University of Waterloo, (2003).

(Continued)

*Primary Examiner* — Brandon S Cole
(74) *Attorney, Agent, or Firm* — Birch, Stewart, Kolasch & Birch, LLP

(57) ABSTRACT

A storage cell having a pulse generator and a storage element is proposed. The storage element input is connected to receive a data input signal. The storage element output is connected to provide a data output signal. The storage element is operable in one of a data retention state and a data transfer state in response to a storage control signal received from the pulse generator. The pulse generator is connected to receive a clock signal with rising and falling clock signal edges and is adapted to provide control pulses in the storage control signal. Each control pulse has a leading edge and a trailing edge. The control pulses have a polarity suited to invoke the data transfer state on their leading edges. The novel feature is that the pulse generator is adapted to initiate a rising-edge control pulse when receiving a rising clock signal edge and to initiate a falling-edge control pulse when receiving a falling clock signal edge. In this way, a dual-edge-triggered flip-flop may be made using only combinatorial logic circuitry and one level- or single-edge-triggered storage element. The storage cell has low power consumption, facilitates scan testing and can be used by existing design tools and test equipment.

12 Claims, 18 Drawing Sheets

(51) Int. Cl.
*H03K 3/012* (2006.01)
*H03K 3/037* (2006.01)

(56) References Cited

U.S. PATENT DOCUMENTS

| | | | |
|---|---|---|---|
| 5,646,567 | A | 7/1997 | Felix |
| 5,719,516 | A | 2/1998 | Sharpe-Geisler |
| 5,959,915 | A | 9/1999 | Kwon et al. |
| 6,137,331 | A | 10/2000 | Peset Llopis |
| 6,348,825 | B1 | 2/2002 | Galbi et al. |
| 6,989,695 | B2 | 1/2006 | Dike et al. |
| 7,855,587 | B1 * | 12/2010 | Su ................... 327/218 |
| 8,164,363 | B1 * | 4/2012 | Su ................... 327/51 |
| 2001/0052096 | A1 | 12/2001 | Huijbregts |
| 2003/0141913 | A1 * | 7/2003 | Park et al. ............... 327/218 |
| 2004/0041610 | A1 | 3/2004 | Kundu |
| 2004/0075480 | A1 | 4/2004 | Ahn |
| 2004/0246810 | A1 | 12/2004 | Dike et al. |
| 2006/0061400 | A1 | 3/2006 | Tschanz et al. |
| 2006/0085709 | A1 | 4/2006 | Kim et al. |
| 2007/0146033 | A1 | 6/2007 | Pesci |
| 2009/0251183 | A1 * | 10/2009 | Hayashi ............... 327/158 |
| 2010/0007396 | A1 * | 1/2010 | Bailey .................. 327/202 |
| 2011/0141840 | A1 * | 6/2011 | Terzioglu et al. ........ 365/230.06 |
| 2013/0214839 | A1 * | 8/2013 | Alben et al. ............ 327/215 |

OTHER PUBLICATIONS

Johnson et al., "A Single Latch, High Speed Double-Edge Triggered Flip-Flop (DETFF)", Electronics, Circuits and Systems, The 8th IEEE International Conference, vol. 1, pp. 189-192 (2001).

Smith "Application-Specific Integrated Circuits", Addison-Wesley, VLSI Systems Series, Section 2.5.3, pp. 73-74 (1999).

* cited by examiner

LOW-POWER DUAL-EDGE-TRIGGERED STORAGE CELL WITH SCAN TEST SUPPORT AND CLOCK GATING CIRCUIT THEREFORE

This application is a Divisional of co-pending application Ser. No. 13/203,792, filed on Aug. 29, 2011, and for which priority is claimed under 35 U.S.C. §120. Application Ser. No. 13/203,792 is the national phase of PCT International Application No. PCT/EP2010/053293 filed on Mar. 15, 2010 under 35 U.S.C. §371. This application claims priority of DK Application No. PA200900399, filed on Mar. 23, 2009 and EP Application No. 09160511.3, filed on May 18, 2009, respectively, under 35 U.S.C. §119; the entire contents of all are hereby incorporated by reference.

TECHNICAL FIELD

The present invention relates to low-power dual-edge-triggered storage cells with support for scan testing and clock gating circuits therefor. More specifically, the present invention relates to dual-edge-triggered (DET) flip-flops with low power consumption and built-in circuitry for facilitating automatic circuit testing and to circuits for gating the clock signals supplied to such DET flip-flops.

The invention may e.g. be useful in applications such as hearing aids, in which the power consumption of digital circuits is of major concern.

BACKGROUND ART

U.S. Pat. No. 5,959,915 to Kwon et al. discloses a method of testing an integrated circuit, such as a dynamic RAM, by doubling the applied clock frequency. The clock frequency is modified by means of a pulse generator, which may be switched between being in a doubling and in a non-doubling mode.

US patent application 2004/0041610 by Kundu discloses a DET flip-flop comprising two single-edge-triggered (SET) flip-flops responding respectively to oppositely directed transitions of the clock signal and with their outputs multiplexed according to the phases of the clock signal. The document further discloses circuitry for supporting so-called scan testing of the circuitry surrounding the flip-flop. Scan testing comprises the steps of clocking test input data into a set of flip-flops in a test mode, triggering the clock signal once in the normal mode and subsequently reading the output of the flip-flops as test output data. The disclosed circuitry comprises separate test mode clock signals for each of the SET flip-flops.

US patent application 2001/0052096 by Huijbregts discloses an SET flip-flop with circuitry for supporting scan testing.

U.S. Pat. No. 6,828,837 to Ahn discloses an SET flip-flop with a gating circuit for preventing a clock signal from triggering the flip-flop when the data input equals the data output. The purpose is to reduce the power consumed. The document further discloses providing the gated clock as a pulsed clock signal. U.S. Pat. No. 5,498,988 to Reyes et al also discloses an SET flip-flop with a gating circuit for preventing a clock signal from triggering the flip-flop when the data input equals the data output.

U.S. Pat. No. 5,719,516 to Sharpe-Geisler discloses a circuit for modifying a clock signal for a DET flip-flop. The outgoing clock signal transitions arbitrarily in synchronisation with the rising and/or falling edges of the incoming clock signal. The circuit allows selective enabling and disabling of transitions for each edge direction of the incoming clock signal.

U.S. Pat. No. 5,646,567 to Felix discloses a DET flip-flop with circuitry for supporting scan testing. The flip-flop may be switched between being in an SET and in a DET mode in order to facilitate testing.

U.S. Pat. No. 6,137,331 to Peset Llopis and U.S. Pat. No. 7,109,776 to Tschanz et al. disclose circuits for supplying a clock signal for DET circuitry, such as DET flip-flops. The circuits comprise means for disabling the clock signal output.

DISCLOSURE OF INVENTION

Low power consumption, small size and reliable functioning are crucial requirements for electronic circuitry to be used in hearing aids. The requirement for low power consumption makes it obvious to consider using DET circuitry in the storage cells of the digital signal processors, which are part of today's advanced hearing aids. The use of DET circuitry mainly allows for reducing the power consumed by the clock circuitry. DET circuitry, however, requires more space or "real estate" on the processor chips than SET circuitry and further presents a number of problems to the tools commonly used for designing and testing digital circuitry on electronic chips. Specifically, the widely adopted standards for scan testing were not designed for DET circuitry and cannot work with DET circuitry. As a consequence hereof, DET circuitry and/or the surrounding circuitry in digital processors may not be completely testable in the production facility, which is contrary to the requirement for reliability. Furthermore, the commonly used tools for designing digital chips are also not adapted to DET circuitry, which makes designing with DET circuitry a tedious, and thus expensive, task with a high risk of making design errors.

There is therefore a need for a DET storage cell, which may be easily used within existing design and test tools for SET circuitry, which supports scan testing, which occupies little space on the processor chip, and which consumes little power in use. None of the above mentioned prior art documents disclose a DET storage cell, which fulfils all of these requirements. It is an object of the present invention to provide such a storage cell.

It is a further object of the present invention to provide a DET storage cell, which may be implemented using a minimum number of storage elements, such as flip-flops and latches.

It is a further object of the present invention to provide a DET storage cell, which may be implemented using level-controlled storage elements.

It is a further object of the present invention to provide a DET storage cell with reliable control signals for the storage elements.

It is a further object of the present invention to provide a DET storage cell, wherein control signals for the storage elements adapt automatically to changes in transistor technology, supply voltage, temperature etc.

It is a further object of the present invention to provide a DET storage cell, which consumes a minimum of power when subjected to a data input signal, which changes infrequently.

It is a further object of the present invention to provide a DET storage cell, the function of which may be extensively tested.

It is a further object of the present invention to provide a DET storage cell, which supports scan testing.

It is a further object of the present invention to provide a DET storage cell, which supports scan testing using test equipment dedicated to testing SET circuitry.

It is a further object of the present invention to provide a DET storage cell, which may be modelled in design tools dedicated to designing SET circuitry.

It is a further object of the present invention to provide a DET storage cell, which may be selectively switched between being in a DET mode and in an SET mode.

It is a further object of the present invention to provide a DET storage cell, which may be selectively switched between being in a DET mode and in an SET mode and while being in the SET mode may be selectively switched between being a positive-edge-triggered storage cell and a negative-edge-triggered storage cell.

Clock gating is a generally applied technique to reduce the power consumed in clock supply trees, and it is desirable to apply it to the DET storage cell according to the present invention as well. However, none of the above mentioned prior art documents disclose a clock gating circuit, which fully supports the functionality of the DET storage cell according to the present invention. It is a further object of the present invention to provide such a clock gating circuit.

It is a further object of the present invention to provide a clock gating circuit, which consumes less power and space than prior art clock gating circuits.

Objects of the invention are achieved by the invention described in the accompanying claims and as described in the following.

An object of the invention is achieved by a storage cell having a data output terminal, a clock terminal, a pulse generator, a storage element and an input circuit. The storage element has a storage input and a storage output. The storage input is connected to receive a data input signal from the input circuit. The storage output is connected to provide a data output signal to the data output terminal. The storage element is operable in one of a data retention state and a data transfer state in response to a storage control signal received from the pulse generator. The pulse generator is connected to receive a clock signal with rising and falling clock signal edges from the clock terminal and is adapted to provide control pulses in the storage control signal. Each control pulse has a leading edge and a trailing edge. The control pulses have a polarity suited to invoke the data transfer state on their leading edges. The novel features are that each control pulse is one of a rising-edge control pulse and a falling-edge control pulse, and that the pulse generator is adapted to initiate a rising-edge control pulse when receiving a rising clock signal edge and to initiate a falling-edge control pulse when receiving a falling clock signal edge. In this way, a DET flip-flop may be made using only combinatorial logic circuitry and one SET storage element. This allows for lower power consumption than prior art DET storage cells.

Advantageously, the storage element is adapted to temporarily invoke the data transfer state in response to a transition of the storage control signal. This allows for using a conventional edge-triggered SET flip-flop as storage element.

Advantageously, the storage element is adapted to be in the data retention state when the storage control signal has a first logic level, and in the data transfer state when the storage control signal has a second logic level, the second logic level being the negation of the first logic level. This allows for using a conventional level-controlled latch as storage element. Level-controlled latches typically require less chip space and consume less power than edge-triggered flip-flops.

Advantageously, the pulse generator is connected to receive the data output signal as well as the data input signal and is adapted to terminate an initiated control pulse when the logic level of the data output signal has a predefined relationship to the logic level of the data input signal. In this way, the duration of the control pulse may be automatically adapted to the propagation delay in the storage element, thus making the control of the storage element reliable and insensitive to changes in e.g. transistor technology, supply voltage or temperature.

Advantageously, the pulse generator is connected to receive the data output signal as well as the data input signal and is adapted to disable the initiation of control pulses when the logic level of the data output signal has a predefined relationship to the logic level of the data input signal. In this way, the control circuitry of the storage element may not consume dynamic power when the logic level of the data input signal remains unchanged.

Advantageously, the pulse generator comprises a logic circuit connected to receive the clock signal, the data output signal and the data input signal, the logic circuit being adapted to provide a gated clock signal, which is a replica or an inverted replica of the clock signal, the logic circuit further being adapted to idle the gated clock signal when the logic level of the data output signal has a predefined relationship to the logic level of the data input signal. In this way, the pulse generator may consume less dynamic power when the logic level of the data input signal remains unchanged.

Advantageously, the storage cell further has a data input terminal, a test input terminal and a test control terminal, and the input circuit comprises a switch operable to connect one of the data input terminal and the test input terminal to the storage input in response to a test control signal received from the test control terminal. This allows for using the storage cell when scan testing the surrounding circuitry.

Advantageously, the storage cell further has a first trigger control terminal, and the pulse generator further has a first trigger control input being connected to receive a first trigger control signal from the first trigger control terminal, and the pulse generator is further adapted to selectively enable or disable initiation of one of the rising-edge control pulses and the falling-edge control pulses in response to the first trigger control signal. By selectively enabling or disabling either the rising-edge control pulses or the falling-edge control pulses, the storage element may be selectively switched between being in a DET mode and being in an SET mode.

Advantageously, the storage cell further has a second trigger control terminal, and the pulse generator further has a second trigger control input being connected to receive a second trigger control signal from the second trigger control terminal, and the pulse generator is further adapted to selectively enable or disable initiation of the other one of the rising-edge control pulses and the falling-edge control pulses in response to the second trigger control signal. In this way, the storage element may further be selectively switched between functioning as a positive-edge-triggered storage cell and functioning as a negative-edge-triggered storage cell while being in the SET mode.

A further object of the invention is achieved by a clock gating circuit having a storage element, a system clock terminal, a clock gate terminal and a clock output terminal. The storage element has a data output, which is connected to provide a clock signal to the clock output terminal. The clock gating circuit is adapted to provide transitions in the clock signal in response to a system clock signal received on the system clock terminal. The system clock signal has rising and falling system clock signal edges. Each transition in the clock signal coincides with a rising or a falling edge in the system clock signal. The clock gating circuit is further adapted to selectively enable or disable providing transitions in the clock signal in response to a clock gate signal received on the clock gate terminal. The novel features are that the clock gating circuit further comprises a pulse generator, that the storage element is operable in one of a data retention state and a toggling state in response to a trigger signal received from the pulse generator, that the storage element is adapted to toggle the clock signal when being in the toggling state, that the pulse generator is connected to receive the system clock signal and is adapted to provide control pulses in the trigger signal, that each trigger pulse has a leading edge and a trailing edge, that the trigger pulses have a polarity suited to invoke the toggling state on their leading edges, that each trigger pulse further is one of a rising-edge trigger pulse and a falling-edge trigger pulse, and that the pulse generator further is adapted to initiate a rising-edge trigger pulse when receiving a rising system clock signal edge and to initiate a falling-edge trigger pulse when receiving a falling system clock signal edge. In this way, a clock gating circuit may be made using only combinatorial logic circuitry and one SET storage element. This allows for a lower power consumption and a lower space requirement than prior art clock gating circuits.

Advantageously, the clock gating circuit further has a first clock control terminal, the pulse generator further has a first clock control input being connected to receive a first clock control signal from the first clock control terminal, and the pulse generator is further adapted to selectively enable or disable providing one of the rising-edge trigger pulses and the falling-edge trigger pulses in response to the first clock control signal. By selectively enabling or disabling providing either the rising-edge trigger pulses or the falling-edge trigger pulses, the clock gating circuit may be switched between being in a DET mode and being in an SET mode. This allows for using the storage cells supplied from the clock gating circuit during scan testing, even when using test equipment dedicated to testing SET circuitry.

Advantageously, the clock gating circuit further has a second clock control terminal, the pulse generator further has a second clock control input being connected to receive a second clock control signal from the second clock control terminal, and the pulse generator is further adapted to selectively enable or disable providing the other one of the rising-edge trigger pulses and the falling-edge trigger pulses in response to the second clock control signal. In this way, both positive-edge-triggered and negative-edge-triggered circuitry may be scan tested using the storage cells supplied from the clock gating circuit.

It is intended that the structural features of the system described above, in the detailed description of 'mode(s) for carrying out the invention' and in the claims can be combined with any methods disclosed herein, when appropriately substituted by a corresponding process. Embodiments of such methods have the same advantages as the corresponding systems.

Further objects of the invention are achieved by the embodiments defined in the dependent claims and in the detailed description of the invention.

As used herein, the singular forms "a", "an", and "the" are intended to include the plural forms as well (i.e. to have the meaning "at least one"), unless expressly stated otherwise. It will be further understood that the terms "has", "includes", "comprises", "having", "including" and/or "comprising", when used in this specification, specify the presence of stated features, integers, steps, operations, elements and/or components, but do not preclude the presence or addition of one or more other features, integers, steps, operations, elements, components and/or groups thereof. It will be understood that when an element is referred to as being "connected" or "coupled" to another element, it can be directly connected or coupled to the other element, or intervening elements may be present, unless expressly stated otherwise. Furthermore, "connected" or "coupled" as used herein may include wirelessly connected or coupled. As used herein, the term "and/or" includes any and all combinations of one or more of the associated listed items. The steps of any method disclosed herein do not have to be performed in the exact order disclosed, unless expressly stated otherwise.

As used in this specification, the terms "logic level" and "level" refer to logic levels of digital electronic signals, unless otherwise specified. The terms "high" and "low" respectively refer to high logic levels and low logic levels, unless otherwise specified, and are meant to be an abstraction and therefore independent of the actual voltage and/or current levels used in the implementation of the disclosed circuits. Such actual levels may vary substantially, depending on the technology used. Specifically, a high logic level does not necessarily refer to a higher voltage or current level than a low logic level. Phrases like "a signal is/goes high/low", should be interpreted as "the signal has/attains a high/low logic level". A "rising edge", "positive edge" or "positive transition" refers to a signal transition from low to high. A "falling edge", "negative edge" or "negative transition" refers to a signal transition from high to low. High and low levels may also be referred to as "H" and "L" or "1" and "0", respectively.

As used in this specification, the term "terminal" refers to any electrically conductive structure suitable for facilitating an electrical connection to an electronic circuit.

Conventional logic circuits, such as OR-, NOR-, XOR-, AND- and NAND-gates, are, when referred to in this specification and unless otherwise stated, devices with two inputs and a single output, and an inverter is a NOT-gate with a single input and a single output. Each of the mentioned device types performs the corresponding logical operation (i.e. respectively disjunction; disjunction followed by negation; exclusive disjunction; conjunction; disjunction followed by negation; negation) on the signal(s) applied to its input(s) and provides the resulting signal on its output. The devices are positive logic, meaning that logical true equals a high level and logical false a low level.

BRIEF DESCRIPTION OF DRAWINGS

The invention will be explained in more detail below in connection with preferred embodiments and with reference to the drawings in which.

Figure 1:
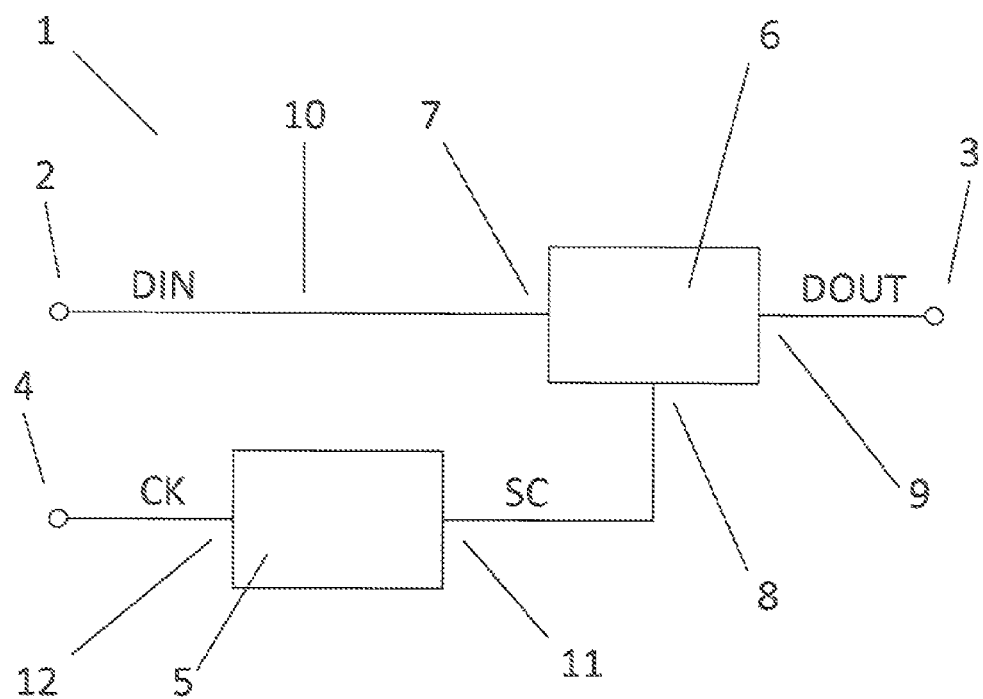
FIG. 1 shows a first embodiment of a storage cell according to the present invention.

The figures are schematic and simplified for clarity, and they just show details, which are essential to the understanding of the invention, while other details are left out. Throughout, the same reference numerals and names are used for identical or corresponding parts. In the signal diagrams, rise-times, fall-times and time differences between individual signals may be exaggerated.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

MODE(S) FOR CARRYING OUT THE INVENTION

A first embodiment of a storage cell 1 is shown in FIG. 1. It has a data input terminal 2, a data output terminal 3, a clock terminal 4, a pulse generator 5, a storage element 6 and an input circuit 10. The pulse generator 5 has an external-clock input 12 as well as a control output 11 and is adapted to provide a control pulse 15, 16 (see FIG. 2) on the control output 11 each time it receives a rising edge 13 or a falling edge 14 on the external-clock input 12. The storage element 6 is a conventional positive-edge-triggered D-type flip-flop with a storage input 7, a storage control input 8 and a storage output 9. The storage element 6 is adapted to react to a rising edge on the storage control input 8 by temporarily changing into a data transfer state, in which it transfers the level on the storage input 7 to the storage output 9, and thereafter autonomously return to a data retention state, in which it holds the level on the storage output 9, regardless of the level on the storage input 7. The timing of the state changes depends on internal circuit delays in the storage element 6.

The storage input 7 is connected to receive a data input signal DIN from the input circuit 10, which in this embodiment is merely a connection between the storage input 7 and the data input terminal 2, and the storage output 9 is connected to provide a data output signal DOUT to the data output terminal 3. The storage control input 8 of the storage element 6 is connected to receive a storage control signal SC from the control output 11 of the pulse generator 5. The external-clock input 12 of the pulse generator 5 is connected to receive a clock signal CK from the clock terminal 4.

Figure 2:
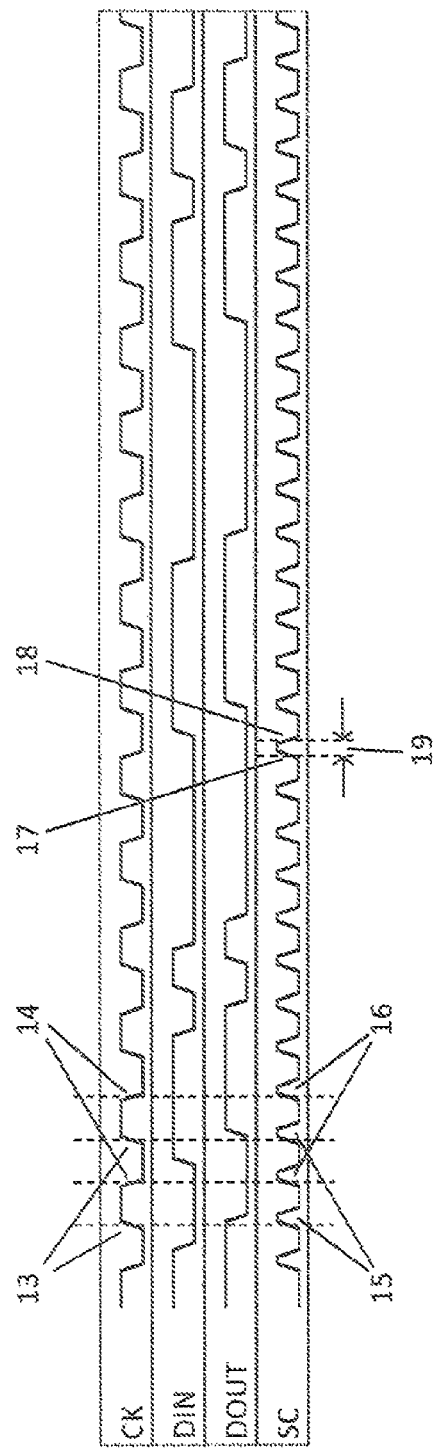
FIG. 2 shows signals illustrating the function of the storage cell of FIG. 1.

The function of the first embodiment of a storage cell 1 is explained with reference to FIG. 1 and to the example signals shown in FIG. 2. An external circuit (not shown) supplies the data input signal DIN to the data input terminal 2 and the clock signal CK to the clock terminal 4. The clock signal CK alternates and has rising edges 13 and falling edges 14 as well as high or low phases between consequtive edges 13, 14. The clock signal CK has a duty cycle of about 50 percent. The data input signal DIN changes randomly, but has stable levels during the transitions 13, 14 of the clock signal CK.

When the pulse generator 5 receives a rising edge 13 in the clock signal CK, it initiates a rising-edge control pulse 15 in the storage control signal SC. When it receives a falling edge 14, it initiates a falling-edge control pulse 16 in the storage control signal SC. Each control pulse 15, 16 has a leading edge 17 occurring at the time of its initiation and a trailing edge 18 occurring at the time of its termination. Each leading edge 17 thus occurs substantially simultaneous with either a rising edge 13 or a falling edge 14 of the clock signal CK. The pulse generator 5 terminates each control pulse 15, 16 after a fixed time delay, thereby determining the duration 19 of each control pulse 15, 16. The duration 19 is dimensioned to be substantially shorter than the time period between any rising or falling edge 13, 14 and the subsequent falling or rising edge 14, 13 of the clock signal CK.

Each leading edge 17 causes the storage element 6 to temporarily change into the data transfer state and transfer the level of the data input signal DIN to the data output signal DOUT. The storage element 6 autonomously returns to the data retention state and holds the level of the data output signal DOUT until the subsequent leading edge 17 occurs. In this way, the data input signal DIN is clocked into the storage element 6. Since a leading edge 17 occurs with every rising or falling edge 13, 14 in the clock signal CK, the storage cell 1 thus functions as a DET flip-flop.

A negative-edge-triggered D-type flip-flop may be used as a storage element 6 in place of the positive-edge-triggered D-type flip-flop. In this case, the pulse generator 5 must be modified to provide the storage control signal SC and the control pulses 15, 16 with inverted polarity.

The storage cell 1 of FIG. 1 is implemented using only a single storage element 6—a conventional edge-triggered D-type flip-flop—and some combinatorial logic. The use of only a single storage element 6 results in a storage cell 1, which occupies relatively little space on the processor chip and also consumes relatively little power during use, compared with prior art DET flip-flops.

Figure 3:
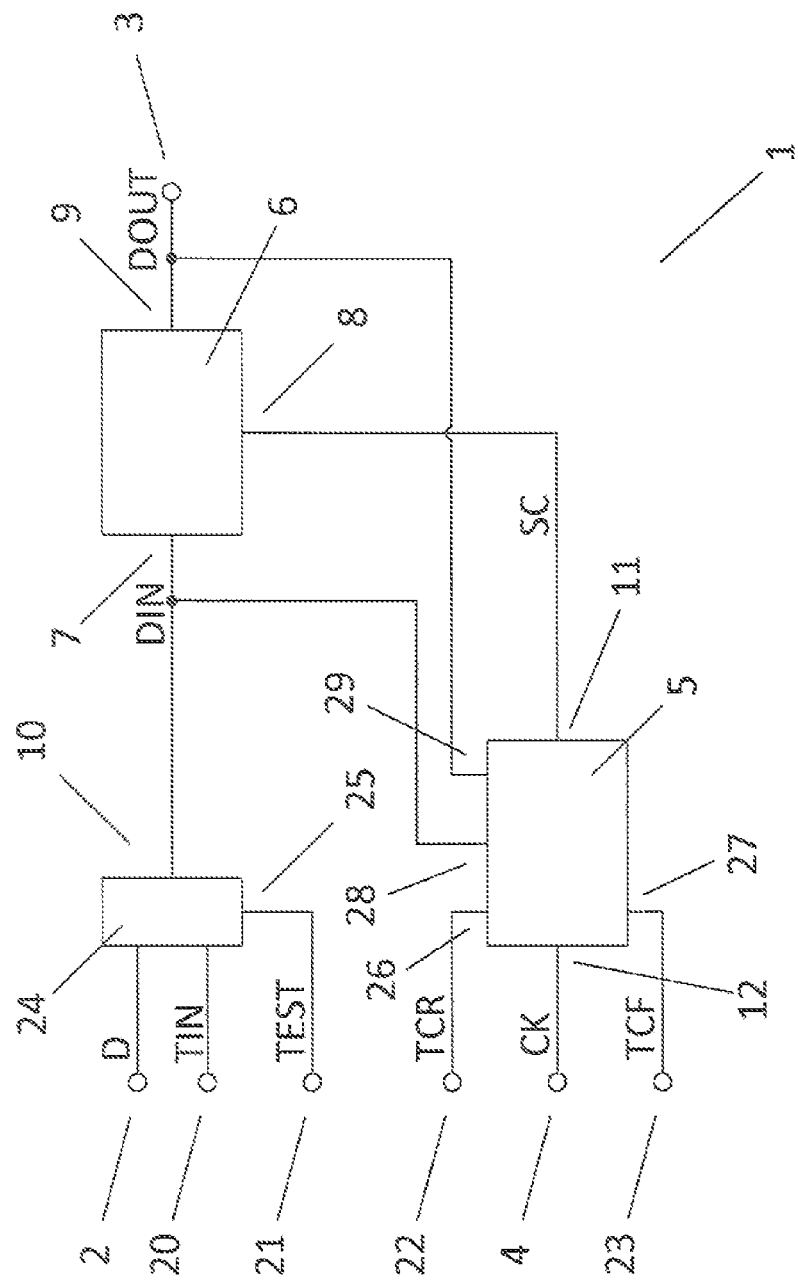
FIG. 3 shows a second embodiment of a storage cell according to the present invention.

A second embodiment of a storage cell 1 is shown in FIG. 3. It has a data input terminal 2, a test input terminal 20, a test control terminal 21, a data output terminal 3, a clock terminal 4, a rising-edge trigger control terminal 22, a falling-edge trigger control terminal 23, a pulse generator 5, a storage element 6 and an input circuit 10 comprising a switch 24. The storage element 6 is a conventional level-controlled latch with a storage input 7, a storage control input 8 and a storage output 9. The storage element 6 is adapted to be in a data transfer state when a high level is applied to the storage control input 8 and in a data retention state otherwise. In the data transfer state, the level on the storage output 9 follows the level on the storage input 7. In the data retention state, the storage element 6 holds the level of the storage output 9, regardless of the level on the storage input 7.

The storage input 7 is connected to receive a data input signal DIN from the switch 24. The switch 24 has a switch control input 25, which is connected to receive a test control signal TEST from the test control terminal 21. The switch 24 is adapted to connect its output and thus the storage input 7 to receive either a data signal D from the data input terminal 2 or a test input signal TIN from the test input terminal 20, depending on the test control signal TEST. The switch 24 may be implemented e.g. as an electronic switch, which actually connects an input to the output, or as a multiplexer, which reproduces one of the input signals on its output. The storage control input 8 is connected to receive a storage control signal SC from a control output 11 of the pulse generator 5. The storage output 9 is connected to provide a data output signal DOUT to the data output terminal 3. An external-clock input 12 of the pulse generator 5 is connected to receive a clock signal CK from the clock terminal 4. A rising-edge trigger control input 26 of the pulse generator 5 is connected to receive a rising-edge trigger control signal TCR from the rising-edge trigger control terminal 22. A falling-edge trigger control input 27 of the pulse generator 5 is connected to receive a falling-edge trigger control signal TCF from the falling-edge trigger control terminal 23. A first sense input 28 of the pulse generator 5 is connected to receive the data input signal DIN from the input circuit 10 and thus from the storage input 7. A second sense input 29 of the pulse generator 5 is connected to receive the data output signal DOUT from the storage output 9 of the storage element 6.

Figure 4:
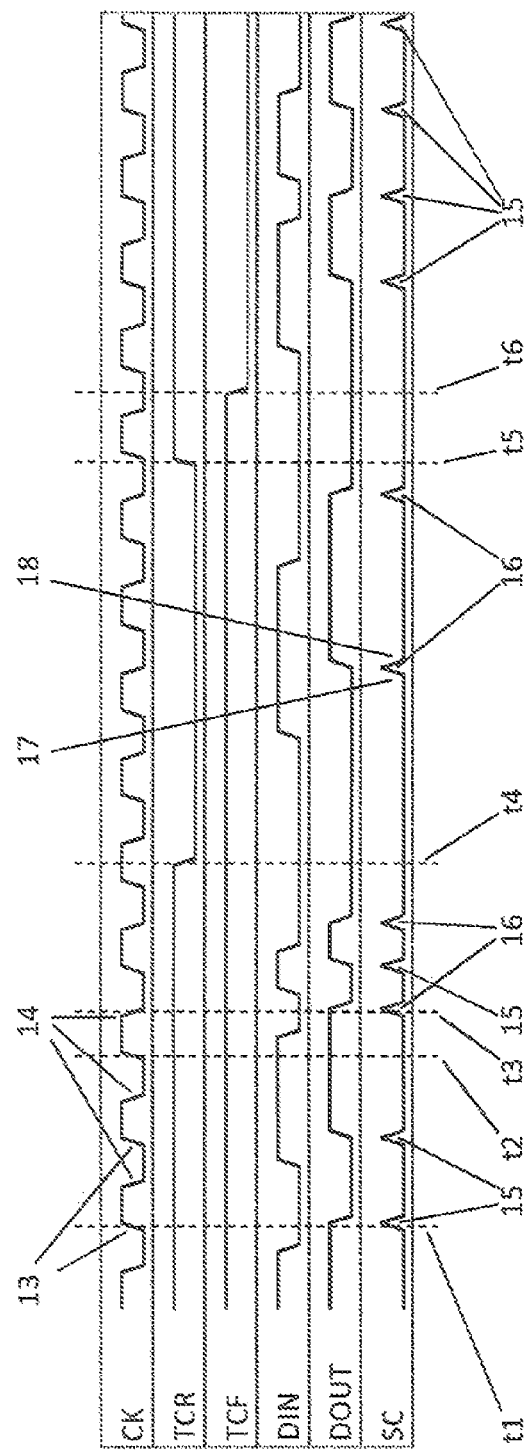
FIG. 4 shows signals illustrating the function of the storage cell of FIG. 3.

The function of the second embodiment of a storage cell 1 is explained with reference to FIG. 3 and to the example signals shown in FIG. 4. An external circuit (not shown) supplies the data signal D (not shown), the test input signal TIN (not shown), the test control signal TEST (not shown), the rising-edge trigger control signal TCR, the clock signal CK and the falling-edge trigger control signal TCF to the respective terminals 2, 20, 21, 22, 4, 23. During normal use of the storage cell 1, the test control signal TEST has a level, which causes the switch 24 to connect the storage input 7 to the data input terminal 2. The data input signal DIN thus equals the data signal D, and in the following description, a reference to one of the signals D, DIN will refer to the other one as well, unless otherwise stated. The clock signal CK alternates and has rising edges 13 and falling edges 14 as well as high or low phases between consequtive edges 13, 14. The clock signal CK has a duty cycle of about 50 percent. The data input signal DIN changes randomly, but has stable levels during the transitions 13, 14 of the clock signal CK. The trigger control signals TCR, TCF are typically set up prior to using the storage cell 1 in order to select its operation mode, i.e. DET, positive-edge-triggered (SET) or negative-edge-triggered (SET). In FIG. 4, however, the trigger control signals TCR, TCF change in order to exemplify their function.

When the pulse generator 5 receives a rising edge 13 in the clock signal CK, it initiates a rising-edge control pulse 15 in the storage control signal SC, however only if both the rising-edge trigger control signal TCR is high and the level of the data input signal DIN differs from the level of the data output signal DOUT. This is e.g. the case at the time t1. If one or both of these conditions are not met, the pulse generator 5 ignores the rising edges 13, which happens e.g. at the time t2, where the data input signal DIN and the data output signal DOUT have equal levels. The rising edges 13 are thus also ignored in the time interval between t4 and t5 where the rising-edge trigger control signal TCR is low.

When the pulse generator 5 receives a falling edge 14 in the clock signal CK, it initiates a falling-edge control pulse 16 in the storage control signal SC, however only if both the falling-edge trigger control signal TCF is high and the level of the data input signal DIN differs from the level of the data output signal DOUT. This is e.g. the case at the time t3. If one or both of these conditions are not met, the pulse generator 5 ignores the falling edges 14. The falling edges 14 are thus ignored after the time t6 where the falling-edge trigger control signal TCF is low.

A detailed description of the internal behavior of the pulse generator 5 may be found in the description further below of two preferred embodiments hereof shown in FIGS. 5 and 7.

Each control pulse 15, 16 has a leading edge 17 occurring at the time of its initiation and a trailing edge 18 occurring at the time of its termination. Each leading edge 17 thus occurs substantially simultaneous with either a rising edge 13 or a falling edge 14 of the clock signal CK.

The storage element 6 receives the control pulses 15, 16 on the storage control input 8. Due to the control pulses 15, 16 being high, each leading edge 17 causes the storage element 6 to change into the data transfer state and transfer the level of the data input signal DIN to the data output signal DOUT. The pulse generator 5 terminates each control pulse 15, 16 as soon as the data output signal DOUT attains the same level as the data input signal DIN, whereby it causes the storage element 6 to change back into the data retention state and hold the level of the data output signal DOUT, regardless of the level of the data input signal DIN. In this way, the data input signal DIN is clocked into the storage element 6.

The storage cell 1 thus functions as a DET flip-flop when both trigger control signals TCR, TCF are high, because a leading edge 17 occurs with every rising or falling edge 13, 14 in the clock signal CK, except when the levels of the data input signal DIN and the data output signal DOUT are equal, in which case storing would not alter the level of the storage output signal DOUT anyway. Similarly, the storage cell 1 functions as a positive-edge-triggered flip-flop when only the rising-edge trigger control signal TCR is high and as a negative-edge-triggered flip-flop when only the falling-edge trigger control signal TCF is high. When both signals TCR, TCF are low, the storage cell 1 holds the level of the data output signal DOUT, regardless of the level of the data input signal DIN and of the edges 13, 14 received in the clock signal CK.

Scan testing of complex circuitry comprising storage cells, such as flip-flops, is typically facilitated by providing means for connecting a plurality of the storage cells to form a so-called scan chain in a test mode. In the normal mode, the storage cells are connected via combinatorial logic circuitry, and the purpose of scan testing is to test both the combinatorial logic circuitry and the storage cells. In the test mode, the storage cells in the scan chain form a shift register, and arbitrary test data vectors may be clocked into and/or out of the memories of the storage cells by asserting the clock signal(s) a number of times equal to the number of storage cells in the scan chain. A scan testing sequence is typically performed by clocking in a test data input vector with the storage cells in the test mode, thereafter asserting the clock signal a single time with the storage cells in the normal mode and then clocking out a test data output vector with the storage cells in the test mode. The test data output vector is then inspected to detect deviations from the expected result. A complete scan test may comprise several thousands of scan test sequences, and the test data input vectors are thus typically generated automatically.

The storage cell 1 in FIG. 3 supports scan testing by being switchable from a normal mode to a test mode by changing the test control input TEST to a level, which causes the switch 24 to connect the storage input 7 to the test input terminal 20. In this case, the data input signal DIN equals the test input signal TIN and not the data signal D. Apart from this, the storage cell 1 is operated substantially as described above for the normal mode. A scan chain may be formed by connecting the test input terminal 20 to a data output terminal of a second storage cell and connecting the data output terminal 3 to a test input terminal of a third storage cell. Depending on the capabilities of the test equipment, the operation modes of the storage cell 1, i.e. DET, positive-edge-triggered (SET) or negative-edge-triggered (SET), may be selected individually for each of the normal mode and the test mode by applying appropriate levels to the trigger control signals TCR, TCF. Seen as a blackbox, the storage cell 1 functions exactly as an SET storage cell when one of the trigger edge polarities is disabled. It may therefore be used during scan testing using automatic test equipment, circuits and/or methods, which are dedicated to testing of SET circuitry.

Scan testing as described above is both simple to perform and may cover nearly all circuit portions of the storage cell 1 and the surrounding circuitry. The steps of the above described scan test sequence may be performed automatically as part of scan testing in existing test equipment for SET circuitry, the only deviation from known scan testing being to apply the appropriate trigger control signals TCR, TCF to the trigger control terminals 22, 23 during the scan testing. Furthermore, nearly all circuit portions of the storage cell 1 may be tested using the scan test sequence described above, since all circuit portions are involved in the test. The DET storage cell 1 according to the present invention thus allows extensive testing of itself and supports scan testing, also when using test equipment dedicated to testing SET circuitry.

The most widely used design tools for designing electronic circuits on chips provide semi- or fully automatic generation of circuits, whereby each circuit will be composed of pre-defined building blocks, such as e.g. a storage cell circuit, from a library. The tools typically perform circuit simulation on the logic gate level, and since they are dedicated to generating and thus simulating SET circuits, they cannot work correctly with known DET storage cell circuits, thereby preventing an efficient design process. The DET storage cell circuit according to the present invention, however, may be simulated correctly when appropriate simulated trigger control signals TCR, TCF are applied to the trigger control terminals 22, 23 before performing the simulation. Thus, the DET storage cell circuit according to the present invention may be used as a building block in such design and synthesis tools without provoking errors or error messages, thereby allowing an efficient design process.

Figure 5:
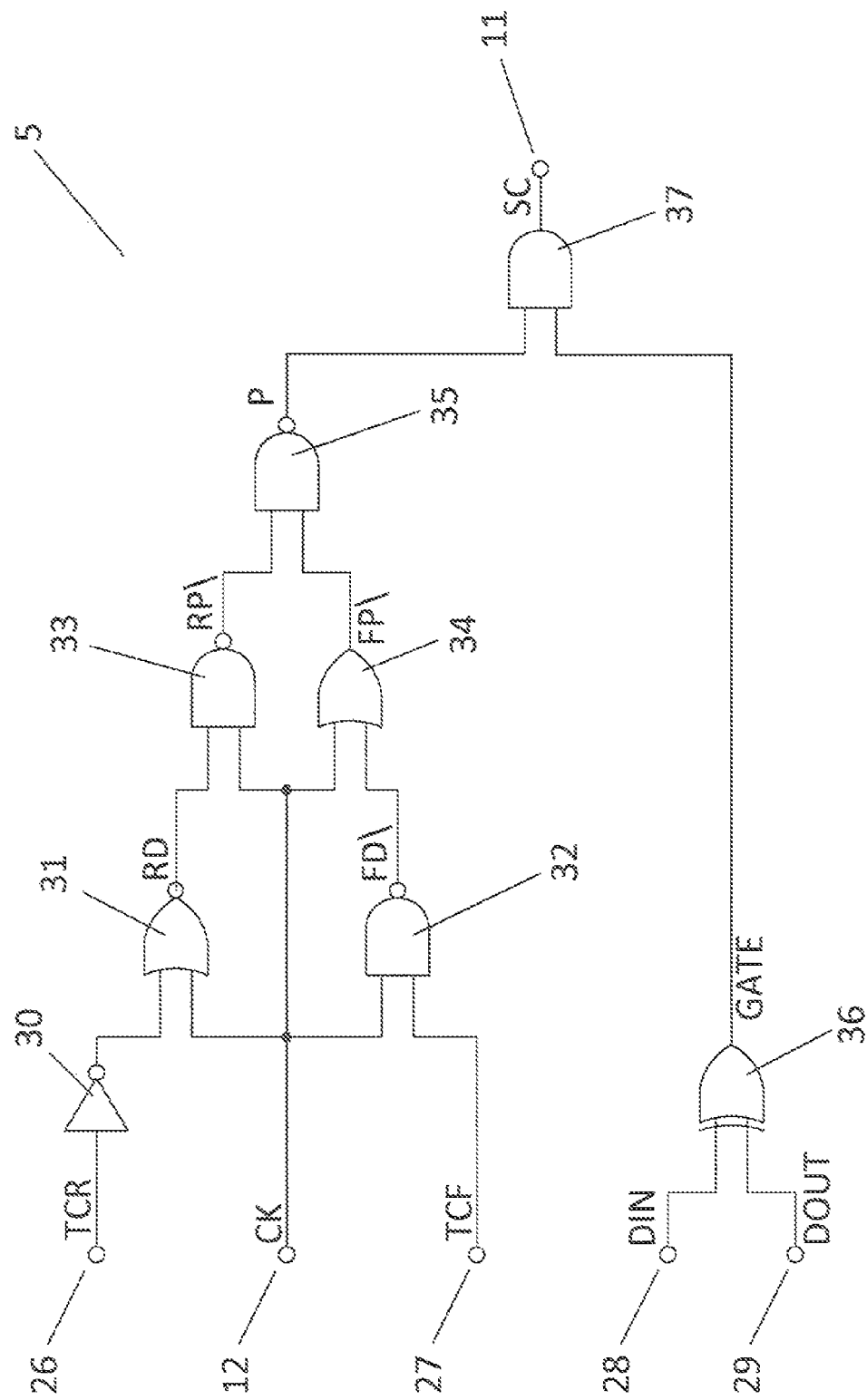
FIG. 5 shows a first embodiment of a pulse generator for the storage cell of FIG. 3.

FIG. 5 shows a first embodiment of the pulse generator 5 shown in FIG. 3. It comprises an inverter 30, a NOR-gate 31, three NAND-gates 32, 33, 35, an OR-gate 34, an XOR-gate 36 and an AND-gate 37, all being conventional logic circuits. Terminals and external signals are numbered and/or named in correspondence with FIG. 3. The input of the inverter 30 is connected to receive the rising-edge trigger control signal TCR from the rising-edge trigger control input 26. A first input of the NOR-gate 31 is connected to the output of the inverter 30, and a second input is connected to receive the clock signal CK from the external-clock input 12. A first input of the first NAND-gate 32 is connected to receive the falling-edge trigger control signal TCF from the falling-edge trigger control input 27, and a second input is connected to receive the clock signal CK from the external-clock input 12. A first input of the second NAND-gate 33 is connected to receive a delayed rising-edge signal RD from the output of the NOR-gate 31, and a second input is connected to receive the clock signal CK from the external-clock input 12. A first input of the OR-gate 34 is connected to receive a delayed falling-edge signal FD\ from the output of the first NAND-gate 32, and a second input is connected to receive the clock signal CK from the external-clock input 12. A first input of the third NAND-gate 35 is connected to receive a rising-edge pulse signal RP\ from the output of the second NAND-gate 33, and a second input is connected to receive a falling-edge pulse signal FP\ from the output of the OR-gate 34. A first input of the XOR-gate 36 is connected to receive the data input signal DIN from the first sense input 28, and a second input is connected to receive the data output signal DOUT from the second sense input 29. A first input of the AND-gate 37 is connected to receive a pulse signal P from the output of the third NAND-gate 35, and a second input is connected to receive a gate signal GATE from the output of the XOR-gate 36.

The function of the first embodiment of the pulse generator 5 is explained with reference to FIG. 5 and to the example signals shown in FIG. 6. The clock signal CK, the trigger control signals TCR, TCF and the data input signal DIN equal the corresponding signals of FIG. 4. The signals in FIGS. 4 and 6 were both computed using the first embodiment of a pulse generator 5, wherefore also the data output signal DOUT and the storage control signal SC of FIG. 6 equal the corresponding signals of FIG. 4.

As mentioned above, the trigger control signals TCR, TCF typically do not change during normal use of the storage cell 1. However, if a change should be necessary, care should be taken not to change the levels of these while the levels of the data input signal DIN and the data output signal DOUT differ from each other, since this may provoke spurious pulses or glitches in the storage control signal SC.

First, it is assumed that the trigger control signals TCR, TCF are both high. In this case, which is shown in the leftmost third of FIG. 6, the delayed rising-edge signal RD and the delayed falling-edge signal FD\ are inverted replica of the clock signal CK, however delayed with respect thereto due to propagation delays in the NOR-gate 31 and in the first NAND-gate 32, respectively. Due to the delaying, the second NAND-gate 33 provides a rising-edge pulse signal RP\, which idles high and has a low pulse each time a rising edge 13 occurs in the clock signal CK, e.g. at the times t1 and t3. Similarly, the OR-gate 34 provides a falling-edge pulse signal FP\, which idles high and has a low pulse each time a falling edge 14 occurs in the clock signal CK, e.g. at the times t2 and t4. The third NAND-gate 35 thus outputs a pulse signal P, which idles low and has a high pulse each time a rising edge 13 or a falling edge 14 occurs in the clock signal CK, e.g. at the times t1, t2, t3 and t4. The gate signal GATE is high when the levels of the data input signal DIN and the data output signal DOUT differ from each other, e.g. at the times t1 and t4. The AND-gate 37 thus allows the pulses in the pulse signal P when the levels of the data input signal DIN and the data output signal DOUT differ from each other, and suppresses the pulses when the signals DIN, DOUT are equal, so that the control pulses 15, 16 in the storage control signal SC only occur when necessary, e.g. at the times t1 and t4. Therefore, the storage control input 8 remains idle when the level of the data input signal DIN does not change between consequtive edges 13, 14 of the clock signal CK, e.g. at the times t2 and t3. This may substantially reduce the power consumption of the storage element 6 and thus of the storage cell 1.

Each control pulse 15, 16 causes the storage element 6 (see FIG. 3) to change into the data transfer state and thus to transfer the level of the data input signal DIN to the data output signal DOUT. This causes the gate signal GATE to return to low and thus terminate the corresponding control pulse 15, 16. The duration 19 (see FIG. 2) of the control pulses 15, 16 thus adapts automatically to changes of the internal circuit timing of the storage element 6, which may be caused by e.g. variations in the supply voltage and/or the operation temperature. The adaptive pulse termination ensures that the control pulses 15, 16 are always long enough to ensure a reliable storing of the level of the data input signal DIN, while still being as short as possible and thus allowing as fast a clock signal CK as possible. Furthermore, the storage cell 1 may be implemented in different semiconductor technologies without changes of the over-all circuit design.

When the rising-edge trigger control signal TCR is low, as is the case e.g. at the time t5, the delayed rising-edge signal RD is forced low, and consequently, the rising-edge pulse signal RP\ is forced high, whereby the rising-edge control pulses 15 are disabled. When the falling-edge trigger control signal TCF is low, as is the case e.g. at the time t6, the delayed falling-edge signal FD\ is forced high, and consequently, the falling-edge pulse signal FP\ is forced high, whereby the falling-edge control pulses 16 are disabled.

The storage cell 1 of FIG. 3 with the pulse generator 5 of FIG. 5 comprises only one storage element 6—a conventional level-controlled latch—and some combinatorial logic circuits. Since latches typically comprise less transistors than edge-triggered flip-flops, the use of only one latch results in a storage cell 1, which both occupies less space and consumes less power during use than prior art DET flip-flops.

The first embodiment of a pulse generator 5 shown in FIG. 5 may be used in the first embodiment of a storage cell 1 shown in FIG. 1, provided that high levels are applied to the trigger control inputs 26, 27. Furthermore, appropriate levels must be applied to the first and second sense inputs 28, 29 in order to force the gate signal GATE high and thus permanently enable the control pulses 15, 16. Alternatively, the pulse generator 5 of FIG. 5 may be modified in order to remove circuit portions, which are superfluous when the mentioned static levels are applied to the trigger control and sense inputs 26, 27, 28, 29 of the pulse generator 5. This modification should be an easy task for the person skilled in the art. In its simplest configuration (not shown), a pulse generator 5 may comprise an inverting XOR-gate and an inverter, the input of the inverter being connected to receive the clock signal CK, which is also supplied to a first input of the inverting XOR-gate, the output of the inverter being connected to a second input of the inverting XOR-gate, and the output of the inverting XOR-gate providing the storage control signal SC.

Figure 7:
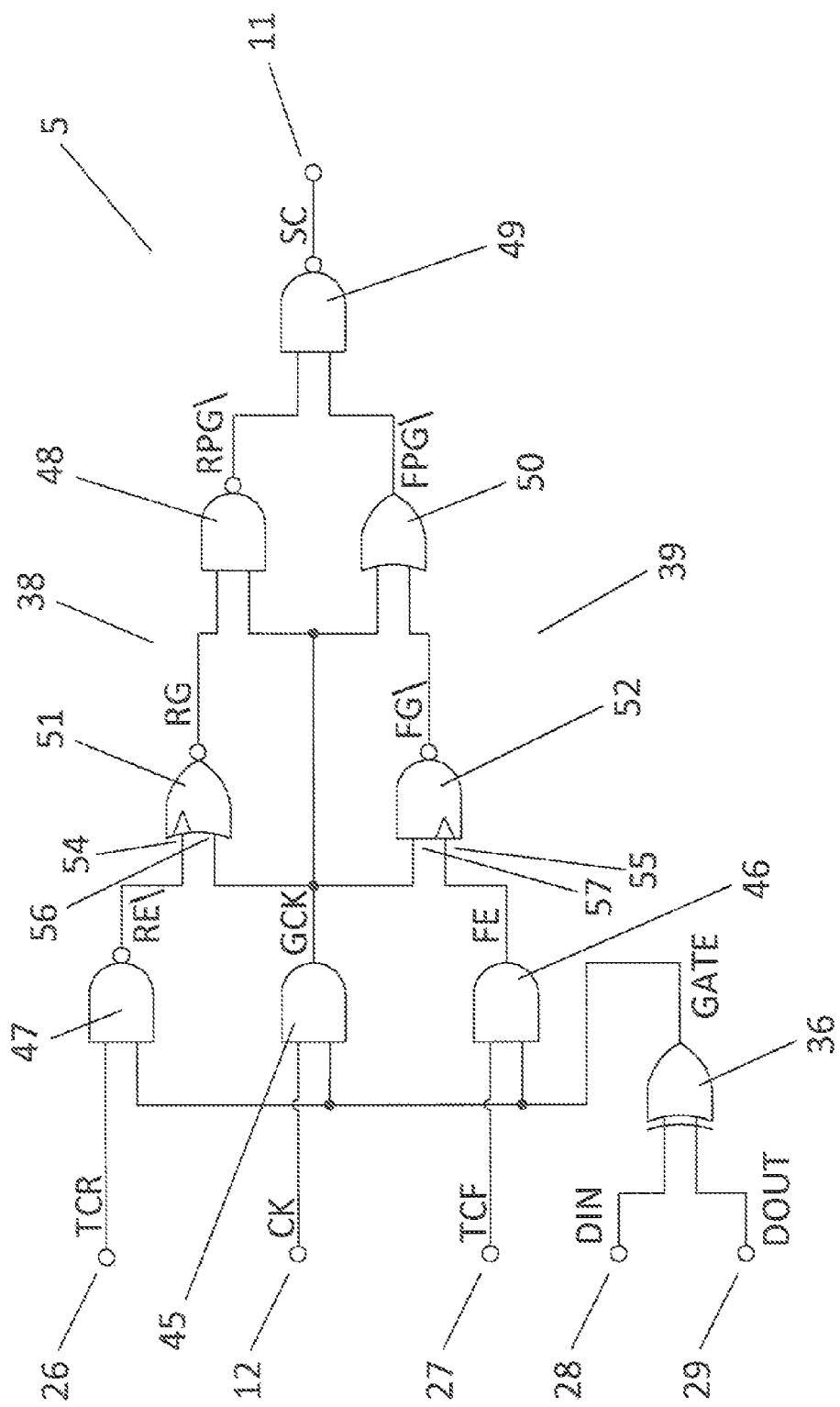
FIG. 7 shows a second, preferred embodiment of a pulse generator for the storage cell of FIG. 3.

FIG. 7 shows a second embodiment of the pulse generator 5 shown in FIG. 3. It comprises an XOR-gate 36, two AND-gates 45, 46, three NAND-gates 47, 48, 49 and an OR-gate 50, all being conventional logic circuits. The pulse generator 5 further comprises a modified NOR-gate 51 and a modified NAND-gate 52, each having an enable input 54, 55 and a clock input 56, 57. Terminals and external signals are numbered and/or named in correspondence with FIG. 3. The modified NOR-gate 51 functions as a conventional NOR-gate, except that when the inputs enter a state wherein the enable input 54 is low and the clock input 56 is high, the modified NOR-gate 51 goes into a hold state, wherein it holds the output level. Table 1 below shows the truth table of the modified NOR-gate 51 with signal names according to FIG. 7. The modified NAND-gate 52 functions as a conventional NAND-gate, except that when the inputs enter a state wherein the enable input 55 is high and the clock input 57 is low, the modified NAND-gate 52 goes into a hold state, wherein it holds the output level. Table 2 below shows the truth table of the modified NAND-gate 52 with signal names according to FIG. 7.

TABLE 1

| RE\ | GCK | RG |
|---|---|---|
| L | L | H |
| L | H | HOLD |
| H | L | L |
| H | H | L |

TABLE 2

| FE | GCK | FG\ |
|---|---|---|
| L | L | H |
| L | H | H |
| H | L | HOLD |
| H | H | L |

The modified gates 51, 52 are described in further detail further below with reference to FIGS. 10 and 11, respectively.

A first input of the XOR-gate 36 is connected to receive the data input signal DIN from the first sense input 28, and a second input is connected to receive the data output signal DOUT from the second sense input 29. The output of the XOR-gate 36 is connected to provide a gate signal GATE to a first input of each of the first and second AND-gates 45, 46 as well as to a first input of the first NAND-gate 47. A second input of the first AND-gate 45 is connected to receive the clock signal CK from the external-clock input 12. A second input of the second AND-gate 46 is connected to receive the falling-edge trigger control signal TCF from the falling-edge trigger control input 27. A second input of the first NAND-gate 47 is connected to receive the rising-edge trigger control signal TCR from the rising-edge trigger control input 26. The output of the first AND-gate 45 is connected to provide a gated clock signal GCK to the clock inputs 56, 57 of each of the modified gates 51, 52 as well as to a first input of each of the second NAND-gate 48 and the OR-gate 50. The output of the first NAND-gate 47 is connected to provide a rising-edge enable signal RE\ to the enable input 54 of the modified NOR-gate 51. The output of the second AND-gate 46 is connected to provide a falling-edge enable signal FE to the enable input 55 of the modified NAND-gate 52. The output of the modified NOR-gate 51 is connected to provide a rising-edge gate signal RG to a second input of the second NAND-gate 48. The output of the modified NAND-gate 52 is connected to provide a falling-edge gate signal FG\ to a second input of the OR-gate 50. The output of the second NAND-gate 48 is connected to provide a gated rising-edge pulse signal RPG\ to a first input of the third NAND-gate 49. The output of the OR-gate 50 is connected to provide a gated falling-edge pulse signal FPG\ to a second input of the third NAND-gate 49. The output of the third NAND-gate 49 is connected to provide the storage control signal SC to the control output 11.

Figure 8:
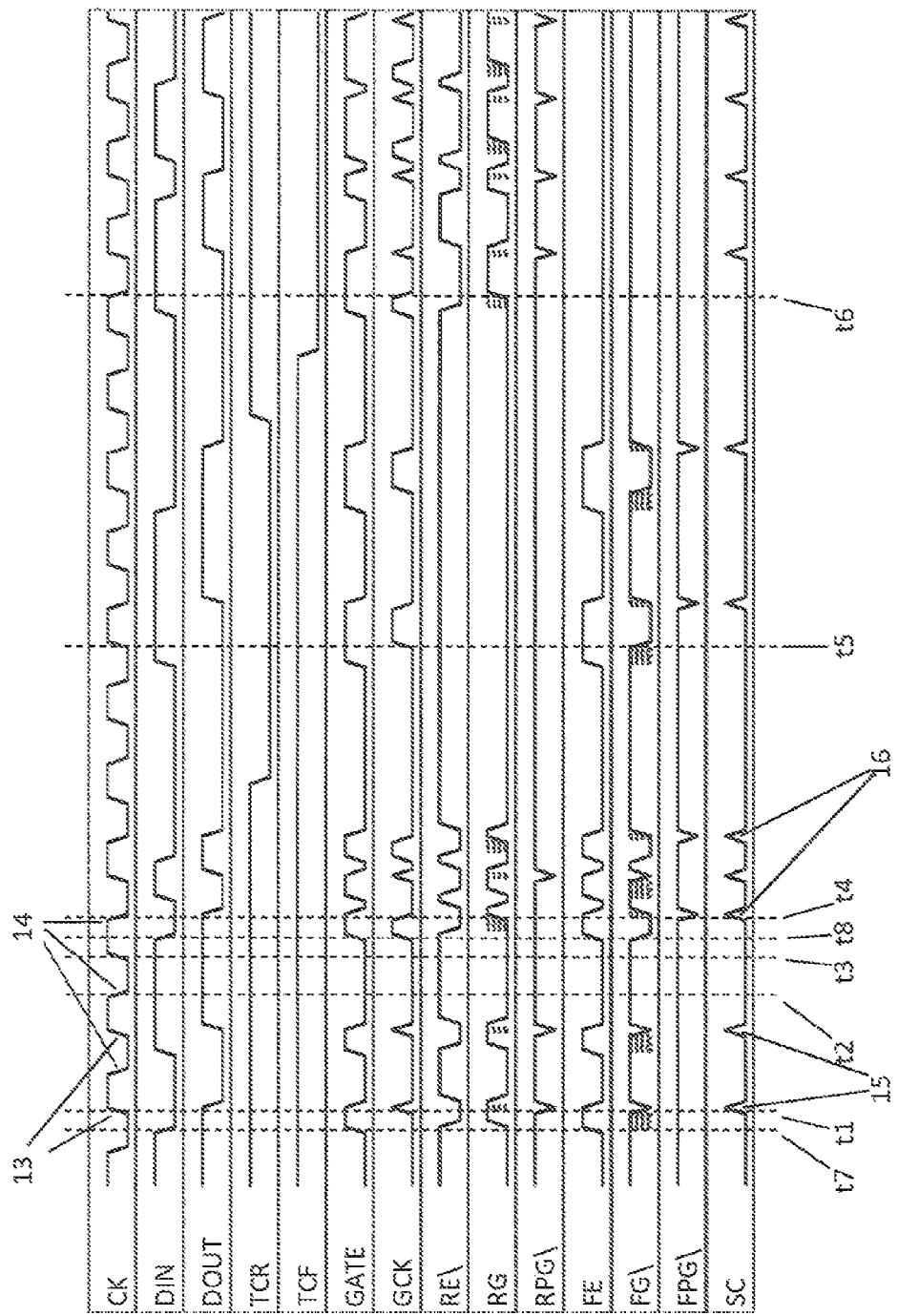
FIG. 8 shows signals illustrating the function of the pulse generator of FIG. 7.

The function of the second embodiment of a pulse generator 5 is explained with reference to FIG. 7 and to the example signals shown in FIG. 8. The clock signal CK, the trigger control signals TCR, TCF and the data input signal DIN equal the corresponding signals of FIG. 6, and the times t1, t2, t3, t4, t5 and t6 are located at corresponding positions with respect to these signals. Seen as blackboxes, the first and second embodiments of a pulse generator 5 behave similarly. The storage control signal SC and the data output signal DOUT of FIG. 8 are thus similar to the corresponding signals of FIG. 6. Only the timing may differ slightly. In FIG. 8, the time periods in which the modified NOR-gate 51 or the modified NAND-gate 52 are in the hold state, are indicated by dotted areas in the respective rising-edge and falling-edge gate signals RG, FG\, e.g. respectively just after the time t1 and between the times t7 and t1.

Figure 6:
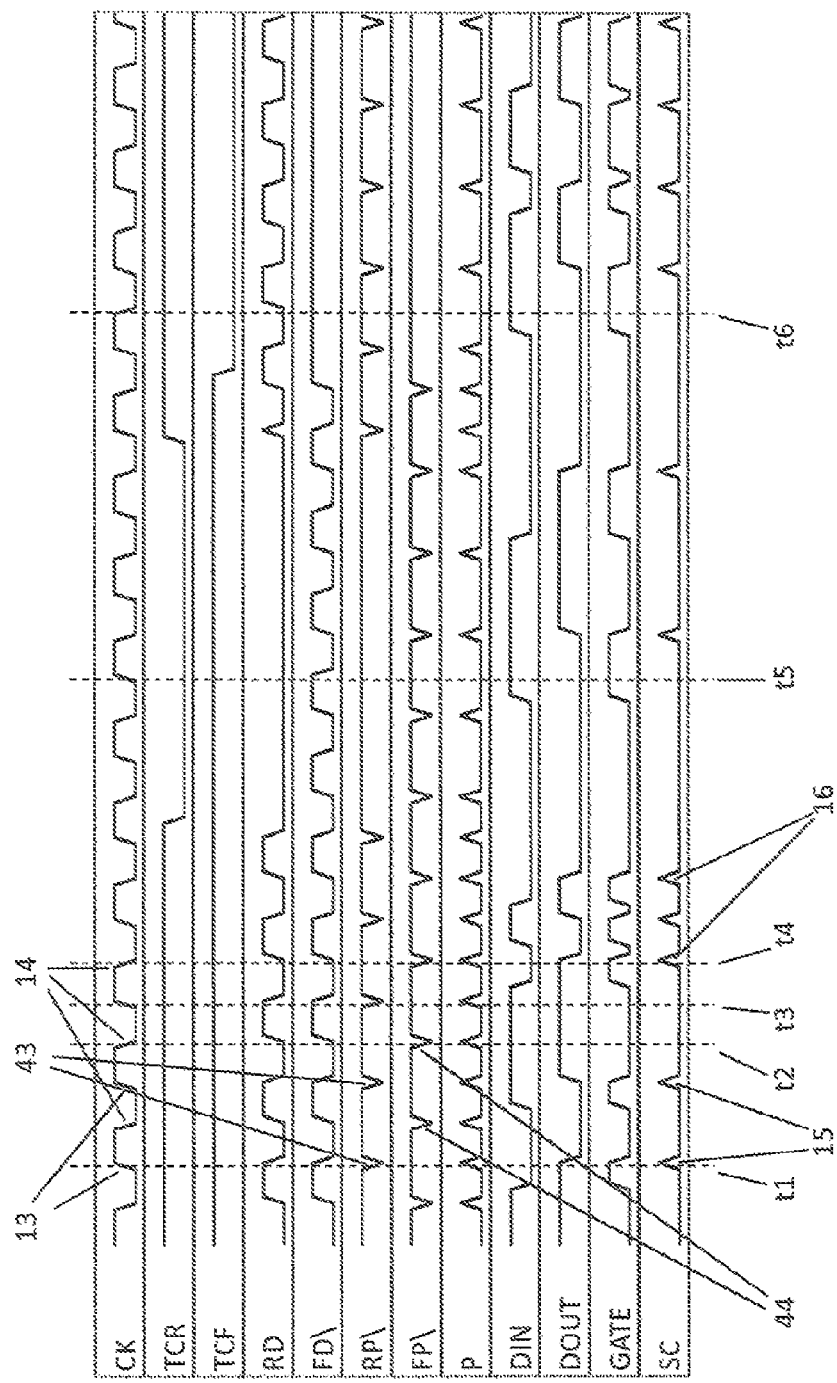
FIG. 6 shows signals illustrating the function of the pulse generator of FIG. 5.

The gate signal GATE, which is composed from the data input signal DIN and the data output signal DOUT, resembles the corresponding signal in FIG. 6. It is high when the levels of the data input signal DIN and the data output signal DOUT differ from each other, e.g. at the times t1, t4, t5 and t6, and low otherwise, e.g. at the times t2 and t3. The XOR-gate 36 thus acts as a comparator, indicating when the data input signal DIN has changed and the storage element 6 therefore should be allowed to store new data on a subsequent rising or falling edge 13, 14 in the clock signal CK, however still depending on the levels of the trigger control signals TCR, TCF.

When the rising-edge trigger control signal TCR is low, e.g. at the time t5, the rising-edge enable signal RE\ is forced high, the rising-edge gate signal RG is forced low and the gated rising-edge pulse signal RPG\ is forced high, so that the level of the storage control signal SC depends solely on the levels of the falling-edge trigger control signal TCF and the clock signal CK. Correspondingly, when the falling-edge trigger control signal TCF is low, e.g. at the time t6, the falling-edge enable signal FE is forced low, the falling-edge gate signal FG\ is forced high and the gated falling-edge pulse signal FPG\ is forced high, so that the level of the storage control signal SC depends solely on the levels of the rising-edge trigger control signal TCR and the clock signal CK. When the trigger control signals TCR, TCF are both low (not shown), the storage control signal SC thus remains low, regardless of the level of the clock signal CK.

When the gate signal GATE is low, e.g. at the time t2, the rising-edge enable signal RE\ is forced high, the rising-edge gate signal RG is forced low, the gated rising-edge pulse signal RPG\ is forced high, the falling-edge enable signal FE is forced low, the falling-edge gate signal FG\ is forced high, the gated falling-edge pulse signal FPG\ is forced high and the storage control signal SC is forced low, regardless of the level of the clock signal CK.

When the gate signal GATE subsequently goes high, the levels in the pulse generator 5 change, depending on whether the transition of the gate signal GATE occurs during the low phase or during the high phase of the clock signal CK. In the following description of these two cases, it is assumed that the trigger control signals TCR, TCF are both high, unless otherwise stated.

If the gate signal GATE goes high during the low phase of the clock signal CK, which is the case e.g. at the time t7, the following happens. The rising of the gate signal GATE causes the rising-edge enable signal RE\ to go low and the falling-edge enable signal FE to go high, while the gated clock signal GCK remains low. This causes the modified NOR-gate 51 to switch the rising-edge gate signal RG to high and the modified NAND-gate 52 to change into the hold state, wherein it holds the high level of the falling-edge gate signal FG\. Since furthermore the gated clock signal GCK is still low, the gated rising-edge pulse signal RPG\ as well as the gated falling-edge pulse signal FPG\ remain high, and the storage control signal SC remains low. When a subsequent rising edge 13 of the clock signal CK occurs, e.g. at the time t1, the gated clock signal GCK goes high, whereby the modified NOR-gate 51 changes into the hold state, wherein it holds the high level of the rising-edge gate signal RG. The rising edge of the gated clock signal GCK thus propagates through the second and third NAND-gates 48, 49 as falling and rising edges in the gated rising-edge pulse signal RPG\ and the storage control signal SC, respectively. A rising-edge control pulse 15 is thus initiated. The rising edge of the gated clock signal GCK furthermore causes the modified NAND-gate 52 to switch the falling-edge gate signal FG\ to low. However, due to the propagation delay in the modified NAND-gate 52, the OR-gate 50 sees the gated clock signal GCK going high before the falling-edge gate signal FG\ goes low, so that it does not change the high level of the gated falling-edge pulse signal FPG\. The delay thus prevents the lower branch 39 of the pulse generator 5 from producing undesired glitches in the storage control signal SC. The rising-edge control pulse 15 causes the storage element 6 to update the data output signal DOUT, which eventually causes the gate signal GATE to return to low and thus terminate the rising-edge control pulse 15. A low level of the falling-edge trigger control signal TCF only affects the signal levels in the lower branch 39; the falling-edge enable signal FE remains low, which causes the modified NAND-gate 52 to keep the falling-edge gate signal FG\ high and consequently the OR-gate 50 to keep the gated falling-edge pulse signal FPG\ high. Since the latter is the case anyway, a low level of the falling-edge trigger control signal TCF does not affect the generation of rising-edge control pulses 15. If, however, the level of the rising-edge trigger control signals TCR is low, which is the case e.g. at the time t5, the rising-edge enable signal RE\ remains high, which causes the modified NOR-gate 51 to keep the rising-edge gate signal RG low and thus prevent the initiation of a rising-edge control pulse 15. The gate signal GATE thus remains high, and the pulse generator 5 reacts to the subsequent falling edge 14 in the clock signal CK in the same way as when the gate signal GATE goes high during the high phase of the clock signal CK as described below. The rising-edge control pulses 15 may thus be disabled by setting the rising-edge trigger control signal TCR low.

If the gate signal GATE goes high during the high phase of the clock signal CK, which is the case e.g. at the time t8, the following happens. The rising of the gate signal GATE causes the rising-edge enable signal RE\ to go low and the falling-edge enable signal FE as well as the gated clock signal GCK to go high. The first NAND-gate 47 is dimensioned to delay its output more than the first and second AND-gates 45, 46, which have approximately equal propagation delays. This ensures that the rising edge of the gated clock signal GCK arrives at the modified NOR-gate 51 before the falling edge of the rising-edge enable signal RE\. The modified NOR-gate 51 thus changes into the hold state while the level of the rising-edge gate signal RG is low and thus holds the low level of the rising-edge gate signal RG. Consequently, the second NAND-gate 48 does not change the high level of the rising-edge pulse signal RPG\. The larger propagation delay within the first NAND-gate 47 thus prevents the rising-edge enable signal RE\ and the gated clock signal GCK from going both low, which would cause the modified NOR-gate 51 to switch the rising-edge gate signal RG to a high level and thus, on a subsequent rising edge in the gated clock signal GCK, initiate an undesired control pulse 15, 16 in the storage control signal SC. Since both the gated clock signal GCK and the falling-edge enable signal FE are high, the modified NAND-gate 52 changes the falling-edge gate signal FG\ to low. However, due to the propagation delay in the modified NAND-gate 52, the rising edge of the gated clock signal GCK arrives at the OR-gate 50 before the falling edge of the falling-edge gate signal FG\, so that the OR-gate 50 does not change the high level of the gated falling-edge pulse signal FPG\. The storage control signal SC thus remains low. When the falling edge 14 of the clock signal CK occurs at the time t4, the gated clock signal GCK goes low, whereby the modified NAND-gate 52 changes into the hold state, wherein it holds the low level of the falling-edge gate signal FG\. The falling edge of the gated clock signal GCK thus propagates through the OR-gate 50 and the third NAND-gate 49 as falling and rising edges in the gated falling-edge pulse signal FPG\ and the storage control signal SC, respectively. A falling-edge control pulse 16 is thus initiated. The falling edge of the gated clock signal GCK furthermore causes the modified NOR-gate 51 to switch the rising-edge gate signal RG to high. However, due to the propagation delay in the modified NOR-gate 51, the second NAND-gate 48 sees the gated clock signal GCK going low before the rising-edge gate signal RG goes high, so that it does not change the high level of the gated rising-edge pulse signal RPG\. The delay thus prevents the upper branch 38 of the pulse generator 5 from producing undesired glitches in the storage control signal SC. The falling-edge control pulse 16 causes the storage element 6 to update the data output signal DOUT, which eventually causes the gate signal GATE to return to low and thus terminate the falling-edge control pulse 16. A low level of the rising-edge trigger control signal TCR only affects the signal levels in the upper branch 38; the rising-edge enable signal RE\ remains high, which causes the modified NOR-gate 51 to keep the rising-edge gate signal RG low and consequently the second NAND-gate 48 to keep the gated rising-edge pulse signal RPG\ high. Since the latter is the case anyway, a low level of the rising-edge trigger control signal TCR does not affect the generation of falling-edge control pulses 16. If, however, the level of the falling-edge trigger control signals TCF is low, which is the case e.g. at the time t6, the falling-edge enable signal FE remains low, which causes the modified NAND-gate 52 to keep the falling-edge gate signal FG\ high and thus prevent the initiation of a falling-edge control pulse 16. The gate signal GATE thus remains high, and the pulse generator 5 reacts to the subsequent rising edge 13 in the clock signal CK in the same way as when the gate signal GATE goes high during the low phase of the clock signal CK as described above. The falling-edge control pulses 16 may thus be disabled by setting the falling-edge trigger control signal TCF low. The rising-edge control pulses 15 and the falling-edge control pulses 16 may thus be disabled independently.

Figure 9:
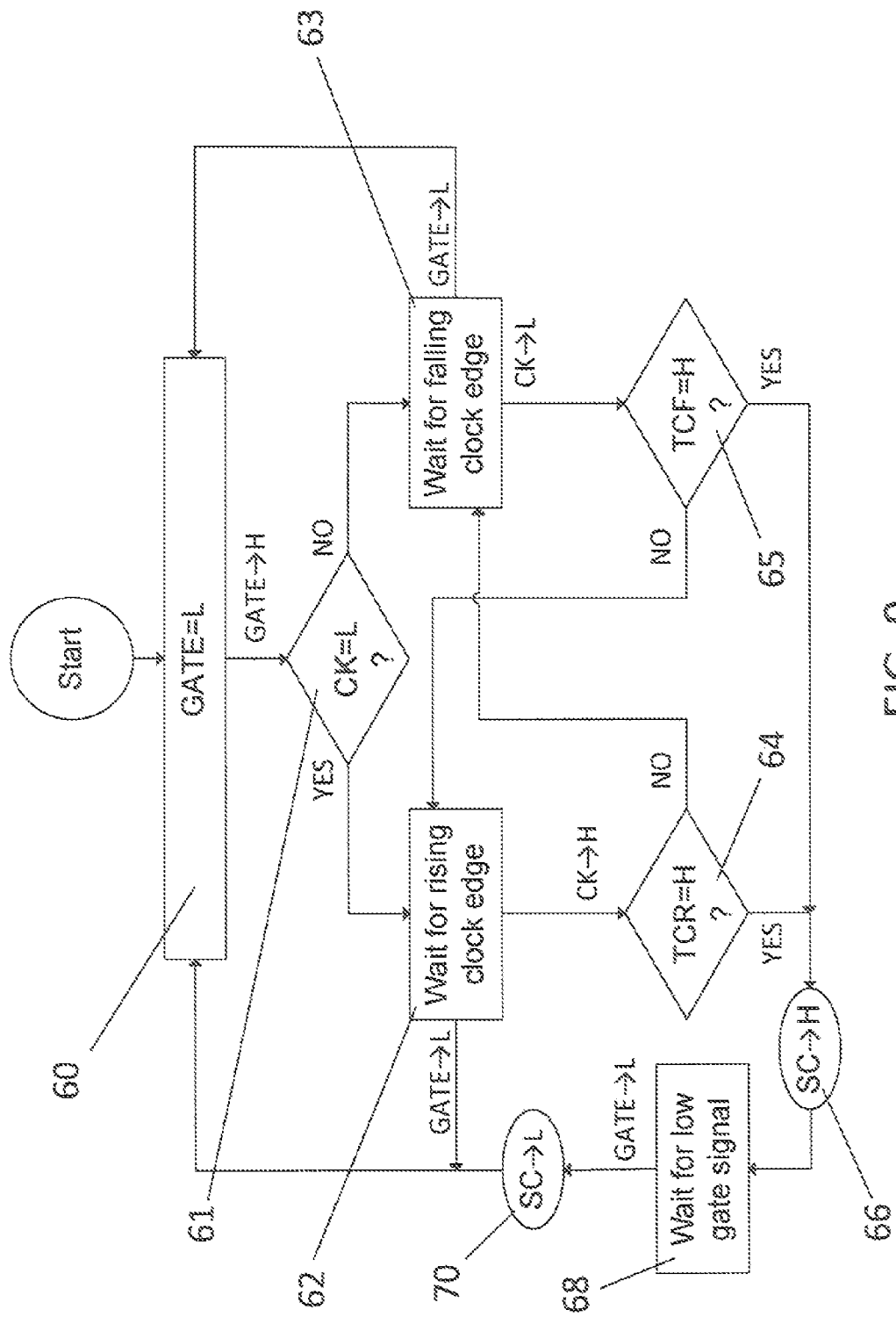
FIG. 9 shows a state chart illustrating the function of the pulse generator of FIG. 7.

The second embodiment of a pulse generator 5 implements the method illustrated by the state chart in FIG. 9. In order for the storage cell 1 to be able to start up in a controlled manner, it may be equipped with a reset input (not shown), which when briefly asserted causes the stored level in the storage element 6 and thus the data output signal DOUT to assume a given reset level, e.g. low. Briefly asserting the reset input and applying the same level as the reset level to the data input terminal 2 thus ensures that the gate signal GATE goes low. The pulse generator 5 then starts in an idle state 60, in which it waits for the gate signal GATE to go high. If the gate signal GATE goes high, the pulse generator 5 proceeds to a first test 61. If the clock signal CK is tested to be low, the pulse generator 5 enters a first wait state 62, in which it waits for a rising edge 13 in the clock signal CK. If the clock signal CK is tested to be high, the pulse generator 5 enters a second wait state 63, in which it waits for a falling edge 14. If, while the pulse generator 5 is in the first or the second wait state 62, 63, the gate signal GATE goes low before a clock signal edge 13, 14 occurs, the pulse generator 5 returns to the idle state 60.

If a rising edge 13 occurs while the pulse generator 5 is in the first wait state 62, the pulse generator 5 proceeds to a second test 64. If the rising-edge trigger control signal TCR is tested to be low, the pulse generator 5 enters the second wait state 63, in which it waits for a falling clock edge 14. If the rising-edge trigger control signal TCR is tested to be high, the pulse generator 5 in a first action 66 initiates a rising-edge control pulse 15 by switching the storage control signal SC to high and then enters a third wait state 68, in which it waits for a low gate signal GATE. If a falling edge 14 occurs while the pulse generator 5 is in the second wait state 63, the pulse generator 5 proceeds to a third test 65. If the falling-edge trigger control signal TCF is tested to be low, the pulse generator 5 enters the first wait state 62, in which it waits for a rising clock edge 13. If the falling-edge trigger control signal TCF is tested to be high, the pulse generator 5 in the first action 66 initiates a falling-edge control pulse 15 by switching the storage control signal SC to high and then enters the third wait state 68, in which it waits for a low gate signal GATE.

The high level of the storage control signal SC, which may be caused by the first action 66, causes the storage element 6 to change into the data transfer state and copy the level of the data input signal DIN to the data output signal DOUT, whereby the gate signal GATE goes low. Hereafter, the pulse generator 5 in a second action 70 terminates the respective rising-edge or falling-edge control pulse 15, 16 by switching the storage control signal SC to low and then returns to the idle state 60. The low level of the storage control signal SC causes the storage element 6 to change into the data retention state.

Seen as a blackbox, the second embodiment of a pulse generator 5 thus functions substantially as the first embodiment and consequently conveys the same advantages to the storage cell 1. The second embodiment, however, is an improvement over the first embodiment with respect to the power consumed and the clock signal load. In the first embodiment, the delayed rising-edge signal RD, the delayed falling-edge signal FD\, the rising-edge pulse signal RP\, the falling-edge pulse signal FP\ and the pulse signal P all switch repeatedly when the pulse generator 5 is subjected to the clock signal CK, regardless of the level of the gate signal GATE. In the second embodiment, no signals switch, unless the gate signal GATE is high. This causes the second embodiment to consume less power than the first embodiment when the data input signal DIN changes infrequently. In the first embodiment, the external-clock input 12 is connected to inputs of the NOR-gate 31, of the first and second NAND-gates 32, 33 as well as of the OR-gate 34. The circuit supplying the clock signal CK is thus loaded by at least eight transistor gates. In the second embodiment, the external-clock input 12 is connected only to an input of the first AND-gate 45, so that the load may be kept as low as two transistor gates. The reduced clock signal load reduces the power consumed by the clock supply circuit and at the same time allows for using a faster clock signal CK. By gating the clock signal CK in the logic circuit formed by the XOR-gate 36 and the first AND-gate 45, thus gating the system clock signal SCK on the input side, less signals are switching when the data input signal DIN changes infrequently than in the first embodiment of the pulse generator 5, wherein the gating takes place on the output side, i.e. in the AND-gate 37.

The second embodiment of a pulse generator 5 shown in FIG. 7 may be used in the first embodiment of a storage cell 1 shown in FIG. 1, provided that high levels are applied to the trigger control inputs 26, 27. Furthermore, appropriate levels must be applied to the first and second sense inputs 28, 29 in order to force the gate signal GATE high and thus permanently enable the control pulses 15, 16. Alternatively, the pulse generator 5 of FIG. 7 may be modified in order to remove circuit portions, which are superfluous when the mentioned static levels are applied to the trigger control and sense inputs 26, 27, 28, 29 of the pulse generator 5. This modification should be an easy task for the person skilled in the art.

Figure 10:
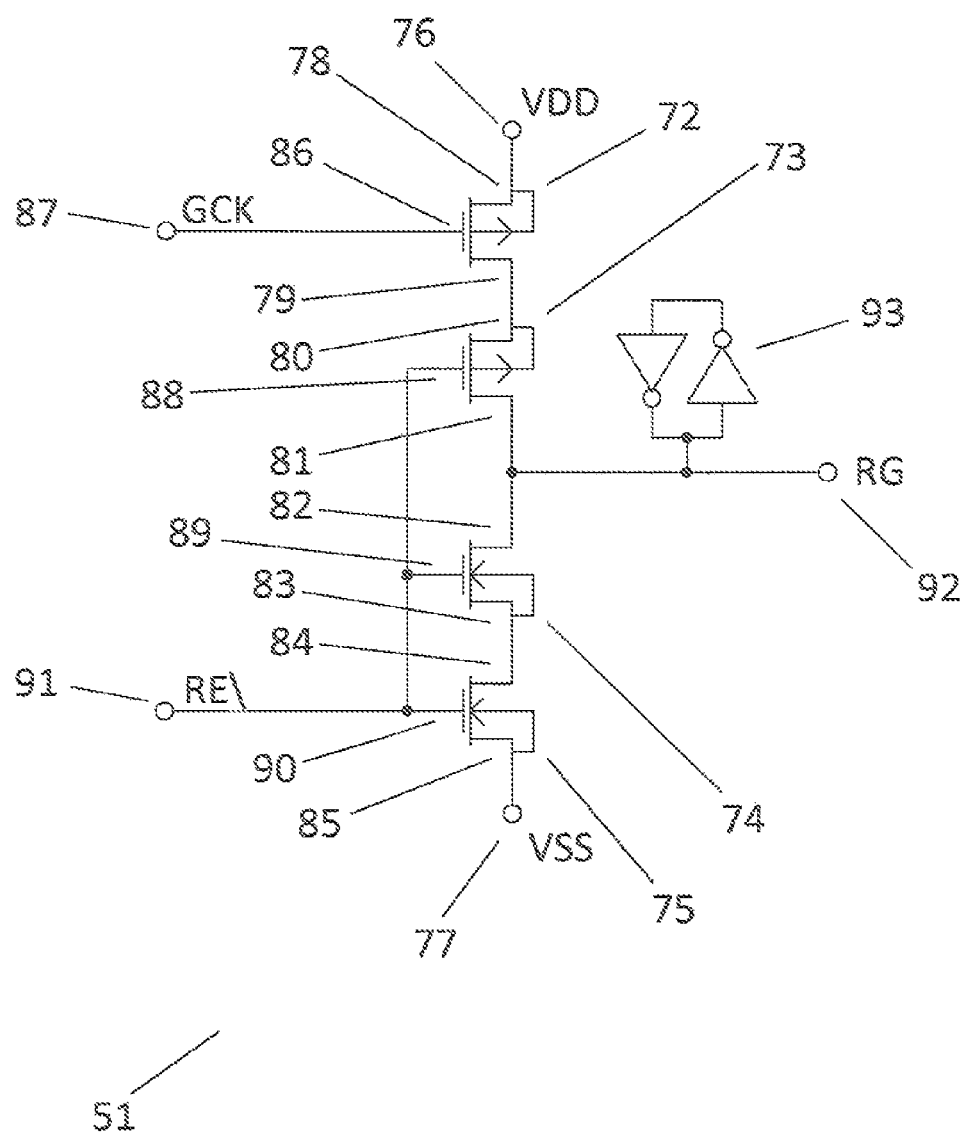
FIG. 10 shows an embodiment of a modified NOR-gate for the pulse generator of FIG. 7.

FIG. 10 shows a preferred embodiment of the modified NOR-gate 51 comprised in the second embodiment of a pulse generator 5. The modified NOR-gate 51 comprises four switch elements 72, 73, 74, 75, a hold circuit 93, a clock input terminal 87, an enable input terminal 91, an output terminal 92, a positive supply terminal 76 and a negative supply terminal 77. Each switch element 72, 73, 74, 75 has a drain, a source and a gate, and may be switched between being in a closed state and being in an open state in response to a control voltage between the gate and the drain or the source. In the closed state, the switch element has a low resistance to currents flowing from the drain to the source, and in the open state, it has a high resistance to such currents. The switch elements 72, 73, 74, 75 are connected in series between the positive supply terminal 76 and the negative supply terminal 77 with the drain 78 of the first switch element 72 being connected to the positive supply terminal 76, the drain 80 of the second switch element 73 being connected to the source 79 of the first switch element 72, the drain 82 of the third switch element 74 being connected to the source 81 of the second switch element 73 and to the output terminal 92, the drain 84 of the fourth switch element 75 being connected to the source 83 of the third switch element 74 and the source 85 of the fourth switch element 75 being connected to the negative supply terminal 77. The gate 86 of the first switch element 72 is connected to the clock input terminal 87. The gates 88, 89, 90 of the remaining switch elements 73, 74, 75 are connected to the enable input terminal 91. The first and second switch elements 72, 73 are conventional P-channel field-effect transistors, each of which is in the closed state, when there is a sufficiently large, negative voltage between the gate 86, 88 and the drain 78, 80, and in the open state otherwise. The two remaining switch elements 74, 75 are conventional N-channel field-effect transistors, each of which is in the closed state, when there is a sufficiently large, positive voltage between the gate 89, 90 and the source 83, 85, and in the open state otherwise. The hold circuit 93 is connected to the output terminal 92 and is dimensioned to hold the level on the output terminal 92 when at least one of the first and second switch elements 72, 73 and at least one of the two remaining switch elements 74, 75 are in the open state, and to allow the switch elements 72, 73, 74, 75 to control the level on the output terminal 92 otherwise.

In the pulse generator 5 of FIG. 7, the clock input terminal 87 receives the gated clock signal GCK as a clock signal, the enable input terminal 91 receives the rising-edge enable signal RE\ as an enable signal, and the output terminal 92 provides the rising-edge gate signal RG as an output signal. Furthermore, the positive supply terminal 76 is connected to a positive supply voltage VDD (not shown in FIG. 7) and the negative supply terminal 77 is connected to a negative supply voltage VSS (not shown in FIG. 7). The modified NOR-gate 51 functions as a conventional NOR-gate, except that when the inputs enter a state wherein the enable signal RE\ is low and the clock signal GCK is high, it goes into a hold state wherein it holds the level of the output signal RG (see Table 1). This is accomplished in the following way. When the enable signal RE\ is high, the second switch element 73 is in the open state, and the third and fourth switch elements 74, 75 are in the closed state, thus providing a low output signal RG, regardless of the level of the clock signal GCK. When both the enable signal RE\ and the clock signal GCK are low, the first and second switch elements 72, 73 are in the closed state and the remaining switch elements 74, 75 are in the open state, thus providing a high output signal RG. In the remaining case, i.e. when the enable signal RE\ is low and the clock signal GCK is high, all four switch elements 72, 73, 74, 75 are in the open state, and the hold circuit 93 holds the level of the output signal RG. The modified NOR-gate 51 is thus in the hold state.

The modified NOR-gate 51 thus provides a NOR-function, in which the effect of a rising edge in the clock signal GCK is delayed until the enable signal RE\ goes high. This function may be useful for synchronising logic signals, such as in the second embodiment of the pulse generator 5.

Figure 11:
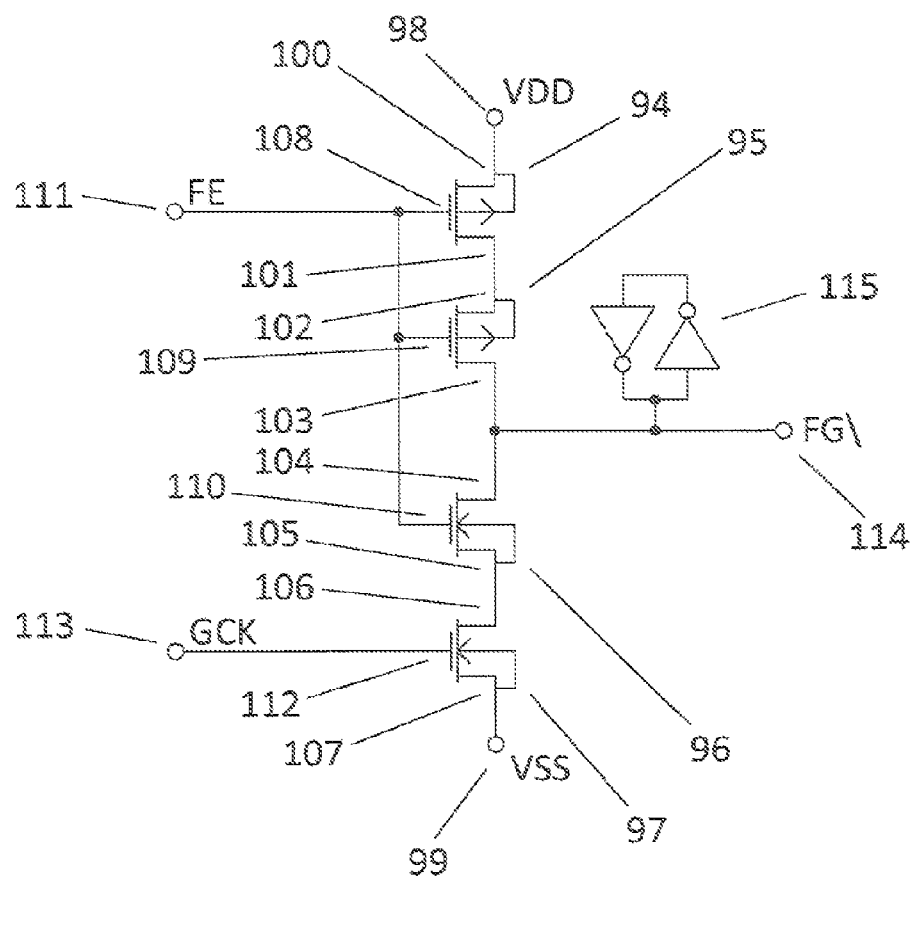
FIG. 11 shows an embodiment of a modified NAND-gate for the pulse generator of FIG. 7.

FIG. 11 shows a preferred embodiment of the modified NAND-gate 52 comprised in the second embodiment of a pulse generator 5. The modified NAND-gate 52 comprises four switch elements 94, 95, 96, 97, a hold circuit 115, a clock input terminal 113, an enable input terminal 111, an output terminal 114, a positive supply terminal 98 and a negative supply terminal 99. Each switch element 94, 95, 96, 97 has a drain, a source and a gate, and may be switched between being in a closed state and being in an open state in response to a control voltage between the gate and the drain or the source. In the closed state, the switch element has a low resistance to currents flowing from the drain to the source, and in the open state, it has a high resistance to such currents. The switch elements 94, 95, 96, 97 are connected in series between the positive supply terminal 98 and the negative supply terminal 99 with the drain 100 of the first switch element 94 being connected to the positive supply terminal 98, the drain 102 of the second switch element 95 being connected to the source 101 of the first switch element 94, the drain 104 of the third switch element 96 being connected to the source 103 of the second switch element 95 and to the output terminal 114, the drain 106 of the fourth switch element 97 being connected to the source 105 of the third switch element 96 and the source 107 of the fourth switch element 97 being connected to the negative supply terminal 99. The gate 112 of the fourth switch element 97 is connected to the clock input terminal 113. The gates 108, 109, 110 of the remaining switch elements 94, 95, 96 are connected to the enable input terminal 111. The first and second switch elements 94, 95 are conventional P-channel field-effect transistors, each of which is in the closed state, when there is a sufficiently large, negative voltage between the gate 108, 109 and the drain 100, 102, and in the open state otherwise. The two remaining switch elements 96, 97 are conventional N-channel field-effect transistors, each of which is in the closed state, when there is a sufficiently large, positive voltage between the gate 110, 112 and the source 105, 107, and in the open state otherwise. The hold circuit 115 is connected to the output terminal 114 and is dimensioned to hold the level on the output terminal 114 when at least one of the first and second switch elements 94, 95 and at least one of the two remaining switch elements 96, 97 are in the open state, and to allow the switch elements 94, 95, 96, 97 to control the level on the output terminal 114 otherwise.

In the pulse generator 5 of FIG. 7, the clock input terminal 113 receives the gated clock signal GCK as a clock signal, the enable input terminal 111 receives the falling-edge enable signal FE as an enable signal, and the output terminal 114 provides the falling-edge gate signal FG\ as an output signal. Furthermore, the positive supply terminal 98 is connected to a positive supply voltage VDD (not shown in FIG. 7) and the negative supply terminal 99 is connected to a negative supply voltage VSS (not shown in FIG. 7). The modified NAND-gate 52 functions as a conventional NAND-gate, except that when the inputs enter a state wherein the enable signal FE is high and the clock signal GCK is low, it goes into a hold state wherein it holds the level of the output signal FG\ (see Table 2). This is accomplished in the following way. When the enable signal FE is low, the third switch element 96 is in the open state, and the first and second switch elements 94, 95 are in the closed state, thus providing a high output signal FG\, regardless of the level of the clock signal GCK. When both the enable signal FE and the clock signal GCK are high, the first and second switch elements 94, 95 are in the open state and the remaining switch elements 96, 97 are in the closed state, thus providing a low output signal FG\. In the remaining case, i.e. when the enable signal FE is high and the clock signal GCK is low, all four switch elements 94, 95, 96, 97 are in the open state, and the hold circuit 115 holds the level of the output signal FG\. The modified NAND-gate 52 is thus in the hold state.

The modified NAND-gate 52 thus provides a NAND-function, in which the effect of a falling edge in the clock signal GCK is delayed until the enable signal FE goes low. This function may be useful for synchronising logic signals, such as in the second embodiment of the pulse generator 5.

It should be obvious to the person skilled in the art that the modified NOR-gate 51 and/or the modified NAND-gate 52 may be implemented using other types of switch elements 72, 73, 74, 75, 94, 95, 96, 97 than field-effect transistors.

DET storage cells 1 according to the invention as described above may be used in large amounts on a single chip, especially when implementing computing circuits, e.g. counters or digital filters, for low-power digital circuits, such as the digital signal processors used in hearing aids. In order to reduce the power consumption further, it is known to idle the clock signal CK supplied to portions of such circuits when the functions performed by these portions are not needed. This is typically accomplished by using so-called clock gating circuits. Known clock gating circuits are, however, not adapted to the DET storage cells 1 according to the invention. A clock gating circuit is therefore needed, which receives a system clock signal with positive as well as negative transitions and provides a clock signal, the clock gating circuit being selectively switchable in response to a control signal between being in an idle mode, being in a dual-edge mode, being in a positive-edge mode and being in a negative-edge mode, wherein the transitions of the clock signal and the transitions of the system clock signal coincide when the clock gating circuit is in the dual-edge mode, wherein the positive transitions of the clock signal and the positive transitions of the system clock signal coincide when the clock gating circuit is in the positive-edge mode, and wherein the negative transitions of the clock signal and the negative transitions of the system clock signal coincide when the clock gating circuit is in the negative-edge mode. When connected to supply a clock signal to a group of storage cells 1 according to the invention, such a clock gating circuit may allow extensive scan testing using the group of storage cells 1, since the clock signal may be selectively switched to provide the specific transitions needed during the individual scan test sequences described further above. Such a clock gating circuit may further allow determining timing delays in the tested group of storage cells 1 and the surrounding circuitry, since the active transitions of the clock signal coincide with corresponding transitions of the system clock signal, and the clock gating circuit thus does not change the timing of the active transitions. In this context, active transitions should be understood as respectively all transitions, as the positive transitions or as the negative transitions, depending on the clock gating circuit being in the DET mode, in the positive-edge-triggered SET mode or in the negative-edge-triggered SET mode. The clock gating circuit described below fulfils these and other objects.

An embodiment of a clock gating circuit 116 for driving DET circuitry, such as the DET storage cells 1 described above, is shown in FIG. 12. The clock gating circuit 116 comprises a pulse generator 117, an edge-triggered flip-flop 118, a NOR-gate 119, two inverters 120, 121, a two-input OR-gate 188, two three-input OR-gates 122, 123 and an AND-gate 124. The clock gating circuit 116 further has a system clock terminal 125, a rising-edge clock control terminal 126, a falling-edge clock control terminal 127, a clock gate terminal 128, a test enable terminal 187, a clock reset terminal 129 and a clock output terminal 130. The flip-flop 118 has a data input 131, a data output 132, a trigger input 133, a set input 134 and a reset input 135. The pulse generator 117 has a system clock input 136, a trigger output 137, a rising-edge clock control input 138, a falling-edge clock control input 139 and a gate input 140. The flip-flop 118 is adapted to switch the data output 132 to a level equal to the level on the data input 131 when a rising edge occurs on the trigger input 133, provided that both the set input 134 and the reset input 135 are high. A low level on the set input 134 immediately forces the data output 132 high, and a low level on the reset input 135 immediately forces the data output 132 low. If both the set input 134 and the reset input 135 are low, the reset input 135 prevails.

The data input 131 is connected to receive an inverted clock signal from the output of the first inverter 120. The data output 132 is connected to provide a clock signal CK to the input of the first inverter 120 and to the clock output terminal 130. The trigger input 133 is connected to receive a trigger signal T from the trigger output 137 of the pulse generator 117. The set input 134 is connected to receive a set signal S\ from the output of the first three-input OR-gate 122. The reset input 135 is connected to receive a reset signal R\ from the output of the AND-gate 124. The system clock terminal 125 is connected to provide a system clock signal SCK to the system clock input 136 of the pulse generator 117, to the input of the second inverter 121 and to a first input of the second three-input OR-gate 123. The output of the second inverter 121 is connected to provide an inverted system clock signal to a first input of the first three-input OR-gate 122. The rising-edge clock control terminal 126 is connected to provide a rising-edge clock control signal CCR to the rising-edge clock control input 138 of the pulse generator 117, to a first input of the NOR-gate 119 and to a second input of the first three-input OR-gate 122. The falling-edge clock control terminal 127 is connected to provide a falling-edge clock control signal CCF to the falling-edge clock control input 139 of the pulse generator 117, to a second input of the NOR-gate 119 and to a second input of the second three-input OR-gate 123. The output of the NOR-gate 119 is connected to provide a clock hold signal CH to a third input of each of the first and second three-input OR-gates 122, 123. The clock gate terminal 128 is connected to provide a clock gate signal CG to a first input of the two-input OR-gate 188. The test enable terminal 187 is connected to provide a test enable signal TE to a second input of the two-input OR-gate 188. The output of the two-input OR-gate 188 is connected to provide a pulse gate signal PG to the gate input 140 of the pulse generator 117. The clock reset terminal 129 is connected to provide a clock reset signal CR\ to a first input of the AND-gate 124, and the output of the second three-input OR-gate 123 is connected to provide an internal-reset signal IR\ to a second input of the AND-gate 124.

The flip-flop 118 and the inverter 120 together function as a storage element, which switches between being in a data retention state and being in a toggling state in response to the trigger signal T. In the data retention state, the storage element 118, 120 retains the level of the clock signal CK. In the toggling state, the storage element 118, 120 toggles the clock signal CK.

Figure 12:
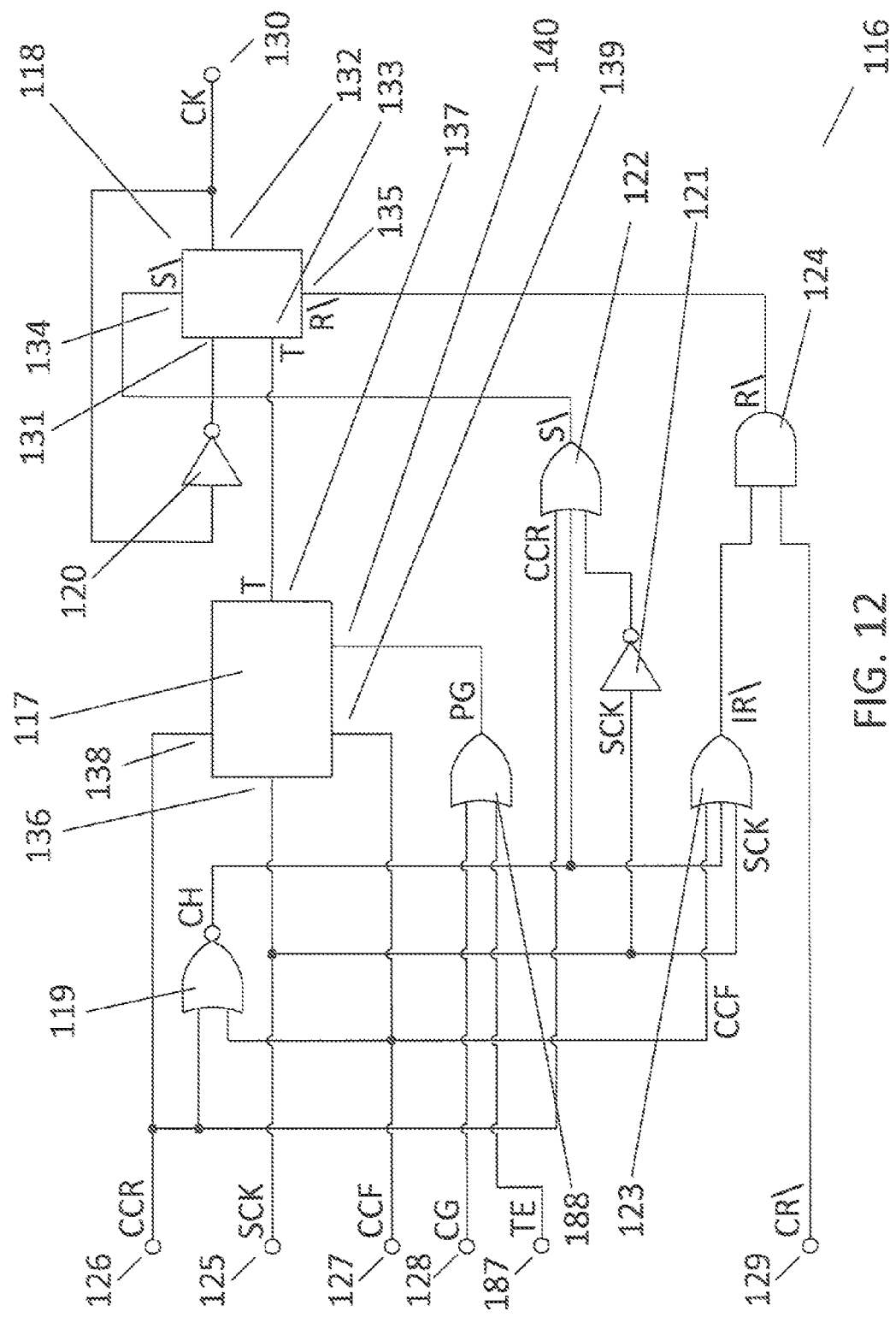
FIG. 12 shows an embodiment of a clock gating circuit for controlling the clock to DET circuitry.
Figure 13:
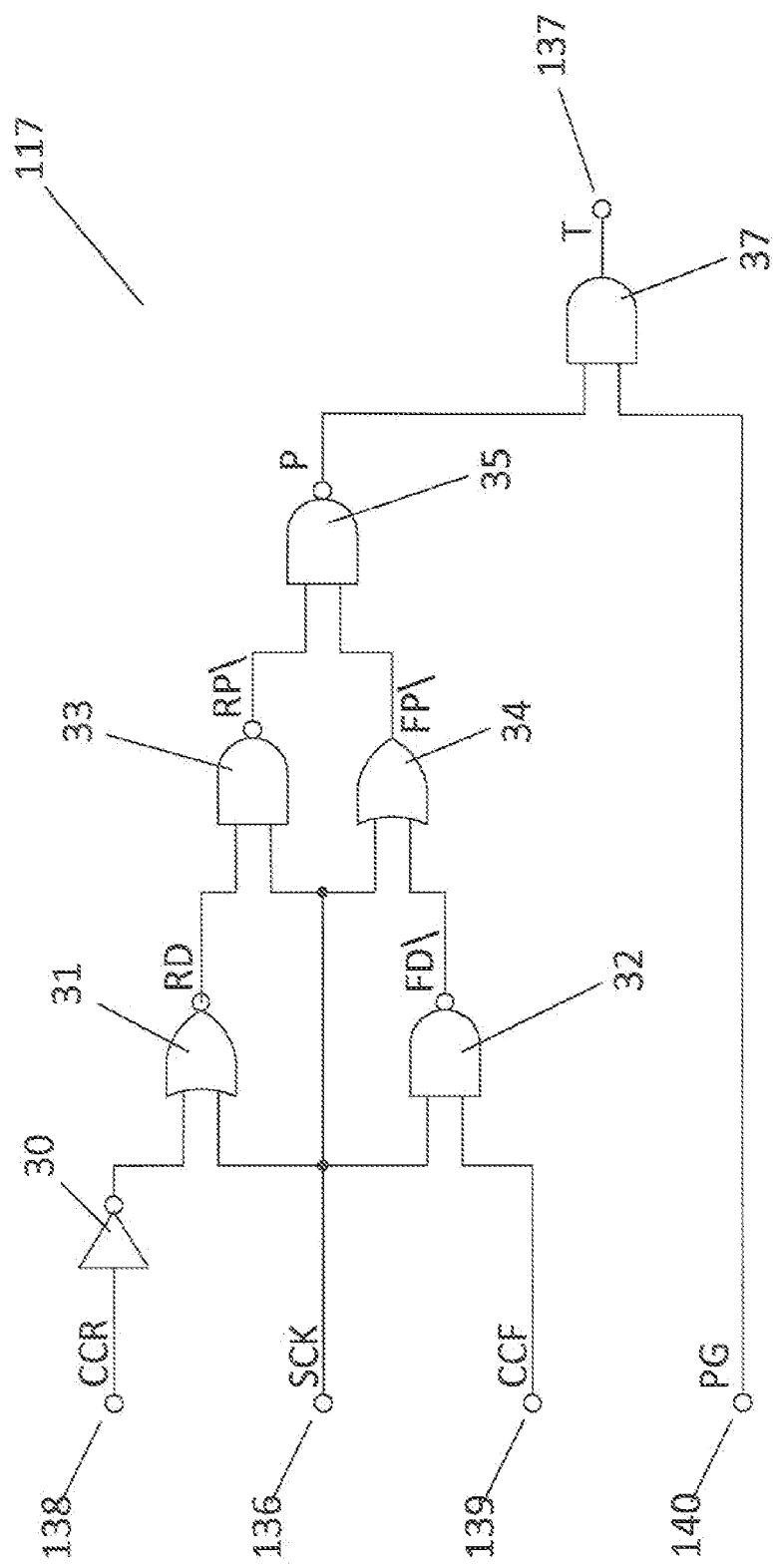
FIG. 13 shows a first embodiment of a pulse generator for the clock gating circuit of FIG. 12.

A first embodiment of the pulse generator 117 for the clock gating circuit 116 is shown in FIG. 13 and is a slightly modified version of the first embodiment of a pulse generator 5 shown in FIG. 5. It differs in that the XOR-gate 36 as well as the two sense inputs 28, 29 are omitted, in that it comprises the gate input 140, and in that the second input of the AND-gate 37 is connected to receive the pulse gate signal PG directly from the gate input 140. In FIG. 13, internal elements and signals have names and/or numbers identical to those shown in FIG. 5, whereas inputs, outputs and external signals have been renamed and/or renumbered to correspond with FIG. 12. The changes are: The input of the inverter 30 is connected to receive the rising-edge clock control signal CCR from the rising-edge clock control input 138; the second input of the NOR-gate 31 is connected to receive the system clock signal SCK from the system clock input 136; the first input of the first NAND-gate 32 is connected to receive the falling-edge clock control signal CCF from the falling-edge clock control input 139, and the second input is connected to receive the system clock signal SCK from the system clock input 136; the second input of the second NAND-gate 33 is connected to receive the system clock signal SCK from the system clock input 136; the second input of the OR-gate 34 is connected to receive the system clock signal SCK from the system clock input 136.

Figure 14:
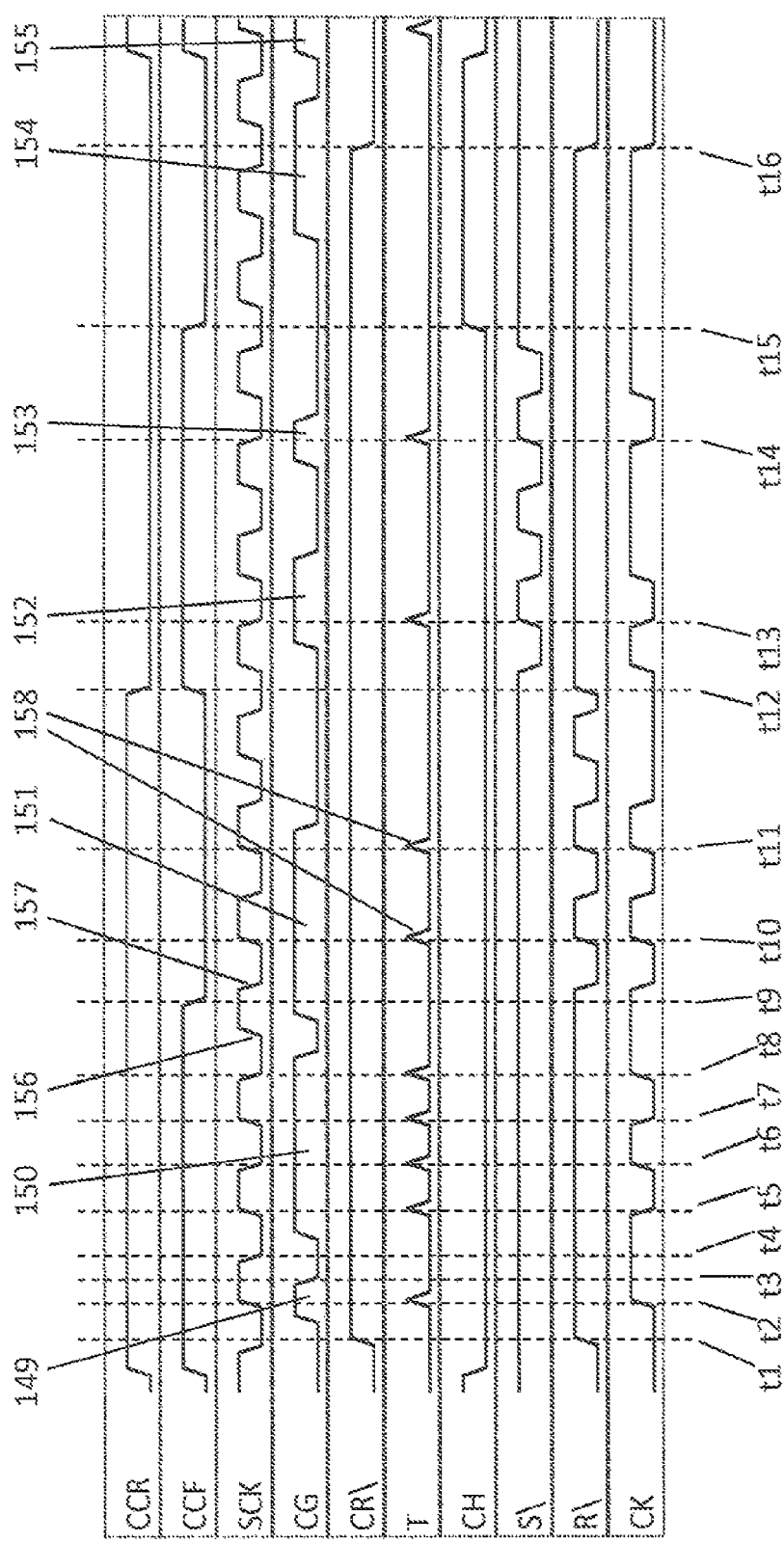
FIG. 14 shows signals illustrating the function of the clock gating circuit of FIG. 12.

The function of the clock gating circuit 116 is explained with reference to FIG. 12, FIG. 13 and the example signals shown in FIG. 14. An external circuit (not shown) supplies the clock control signals CCR, CCF to the clock control terminals 126, 127, the system clock signal SCK to the system clock terminal 125, the clock gate signal CG to the clock gate terminal 128, the test enable signal TE to the test enable terminal 187 and the clock reset signal CR\ to the clock reset terminal 129. The test enable signal TE may be set high in order to force the clock pulse signal PG high, e.g. during scan testing where it may be desirable that all circuits on the chip are active. In the present example, however, the test enable signal TE is held low, so that the pulse gate signal PG equals the clock gate signal CG. The clock control signals CCR, CCF are typically set up prior to using the clock gating circuit 116 in order to select its operation mode, i.e. dual-edge, positive-edge or negative-edge. In FIG. 14, however, the clock control signals CCR, CCF change at the times t9, t12 and t15 in order to exemplify their function. The system clock signal SCK alternates and has rising edges 156 and falling edges 157 as well as high or low phases between consequtive edges 156, 157. The system clock signal SCK has a duty cycle of about 50 percent. The clock gate signal CG, and hence the pulse gate signal PG, changes randomly, but has stable levels during the transitions 156, 157 of the system clock signal SCK. The clock gate signal CG thus has a number of gate pulses 149, 150, 151, 152, 153, 154, 155 with high level, whereof seven are shown in FIG. 14. After setting up the clock control signals CCR, CCF as well as starting the system clock signal SCK, the clock reset signal CR\ is released by switching it to a high level at the time t1 in FIG. 14. The clock reset signal CR\ is reasserted by switching it to a low level at the time t16.

When the clock reset signal CR\ is low, the reset signal R\ and thus the clock signal CK are forced low, regardless of the levels of the remaining input signals CCR, SCK, CCF, CG, TE, and the clock gating circuit 116 is thus in the idle mode. It should be noted, however, that setting the clock reset signal CR\ low while the clock signal CK is high causes a high-to-low transition in the clock signal CK. When the clock reset signal CR\ is high, e.g. between the times t1 and t16, the clock gating circuit 116 functions as described below.

The pulse generator 117 functions in the same way as the pulse generator 5 shown in FIG. 5, except that the gating of the trigger signal T provided on the trigger output 137 is controlled directly by the pulse gate signal PG, which in the present example equals the clock gate signal CG. The pulse generator 117 thus generates short, positive trigger pulses 158 in the trigger signal T, depending on the levels of the clock control signals CCR, CCF as well as on the level of the clock gate signal CG. When the rising-edge clock control signal CCR and the clock gate signal CG are both high, a trigger pulse 158 is generated with every rising edge 156 in the system clock signal SCK, e.g. at the times t2, t5, t7, t10 and t11. When at least one of the rising-edge clock control signal CCR and the clock gate signal CG is low, trigger pulses 158 are not generated with the rising edges 156. When the falling-edge clock control signal CCF and the clock gate signal CG are both high, a trigger pulse 158 is generated with every falling edge 157 in the system clock signal SCK, e.g. at the times t6, t8, t13 and t14. When at least one of the falling-edge clock control signal CCF and the clock gate signal CG is low, trigger pulses 158 are not generated with the falling edges 157. When the set and reset signals S\, R\ are both high, each trigger pulse 158 causes the flip-flop 118 to copy the level on the data input 131 to the clock signal CK. Due to the inverter 120, this causes the flip-flop 118 to toggle the level of the clock signal CK, e.g. at the times t2, t5, t6, t7, t8, t10, t11, t13 and t14. Thus, the pulse generator 117 ensures that when the clock gate signal CG is high, the clock gating circuit 116 provides a transition of the clock signal CK for each rising edge 156 in the system clock signal SCK occurring while the rising-edge clock control signal CCR is high as well as for each falling edge 157 in the system clock signal SCK occurring while the falling-edge clock control signal CCF is high.

When the clock control signals CCR, CCF are both low, e.g. between the times t15 and t16, the pulse generator 117 does not generate any trigger pulses 158. Furthermore, the clock hold signal CH is forced high, which forces the set signal S\, the internal-reset signal IR\ and consequently the reset signal R\ high, so that the flip-flop 118 holds the level of the clock signal CK. The clock gating circuit 116 is thus in the idle mode.

When the clock control signals CCR, CCF are both high, e.g. between the times t1 and t9, the pulse generator 117 generates trigger pulses 158 as described above on both rising and falling edges 156, 157 of the system clock signal SCK occurring while the clock gate signal CG is high. The high levels of the clock control signals CCR, CCF force the set signal S\, the internal-reset signal IR\ and consequently the reset signal R\ high, regardless of the level of the clock hold signal CH. The flip-flop 118 thus toggles the level of the clock signal CK each time a trigger pulse 158 occurs, and holds it otherwise. The clock gating circuit 116 is thus in the dual-edge mode when the clock gate signal CG is high and in the idle mode when the clock gate signal CG is low.

When the rising-edge clock control signal CCR is high and the falling-edge clock control signal CCF is low, e.g. between the times t9 and t12, the pulse generator 117 generates trigger pulses 158 as described above, but only on rising edges 156 of the system clock signal SCK occurring while the clock gate signal CG is high. The high rising-edge clock control signal CCR forces the clock hold signal CH low and the set signal S\ high. The low falling-edge clock control signal CCF and the low clock hold signal CH cause the internal-reset signal IR\ and consequently the reset signal R\ to follow the system clock signal SCK. The clock signal CK is thus forced low during the low phases of the system clock signal SCK. When the clock gate signal CG is high, a rising edge 156 in the system clock signal SCK, e.g. at the time t10, causes the pulse generator 117 to generate a trigger pulse 158 and furthermore forces the internal-reset signal IR\ and consequently the reset signal R\ high. The signal delays within the clock gating circuit 116 are dimensioned to ensure that the reset signal R\ is released well ahead of the rising edge of the trigger pulse 158 so that the flip-flop 118 reacts to the latter by toggling the level of the clock signal CK to a high level. In the first embodiment of the pulse generator 117 shown in FIG. 13, this is accomplished in that a rising edge 156 in the system clock signal SCK passes through three gates, i.e. the second and the third NAND-gates 33, 35 as well as the AND-gate 37, before it appears as a rising edge in a trigger pulse 158, whereas it only passes through two gates, i.e. the second three-input OR-gate 123 and the AND-gate 124, before it appears as a rising edge in the reset signal R\. When the clock gate signal CG is high, the clock signal CK always transitions from low to high when a rising edge 156 in the system clock signal SCK occurs, and the positive transitions of the clock signal CK thus coincide with the positive transitions of the system clock signal SCK. The clock gating circuit 116 is thus in the positive-edge mode when the clock gate signal CG is high and in the idle mode when the clock gate signal CG is low.

When the rising-edge clock control signal CCR is low and the falling-edge clock control signal CCF is high, e.g. between the times t12 and t15, the pulse generator 117 generates trigger pulses 158 as described above, but only on falling edges 157 of the system clock signal SCK occurring while the clock gate signal CG is high. The high falling-edge clock control signal CCF forces the clock hold signal CH low and the internal-reset signal IR\ and consequently the reset signal R\ high. The low rising-edge clock control signal CCR and the low clock hold signal CH cause the set signal S\ to follow the negation of the system clock signal SCK. The clock signal CK is thus forced high during the high phases of the system clock signal SCK. When the clock gate signal CG is high, a falling edge 157 in the system clock signal SCK, e.g. at the time t13, causes the pulse generator 117 to generate a trigger pulse 158 and furthermore forces the set signal S\ high. The signal delays within the clock gating circuit 116 are dimensioned to ensure that the set signal S\ is released well ahead of the rising edge of the trigger pulse 158 so that the flip-flop 118 reacts to the latter by toggling the level of the clock signal CK to a low level. In the first embodiment of the pulse generator 117 shown in FIG. 13, this is accomplished in that a falling edge 157 in the system clock signal SCK passes through three gates, i.e. the OR-gate 34, the third NAND-gate 35 and the AND-gate 37, before it appears as a rising edge in a trigger pulse 158, whereas it only passes through two gates, i.e. the second inverter 121 and the first three-input OR-gate 122, before it appears as a rising edge in the set signal S\. When the clock gate signal CG is high, the clock signal CK always transitions from high to low when a falling edge 157 in the system clock signal SCK occurs, and the negative transitions of the clock signal CK thus coincide with the negative transitions of the system clock signal SCK. The clock gating circuit 116 is thus in the negative-edge mode when the clock gate signal CG is high and in the idle mode when the clock gate signal CG is low.

Figure 15:
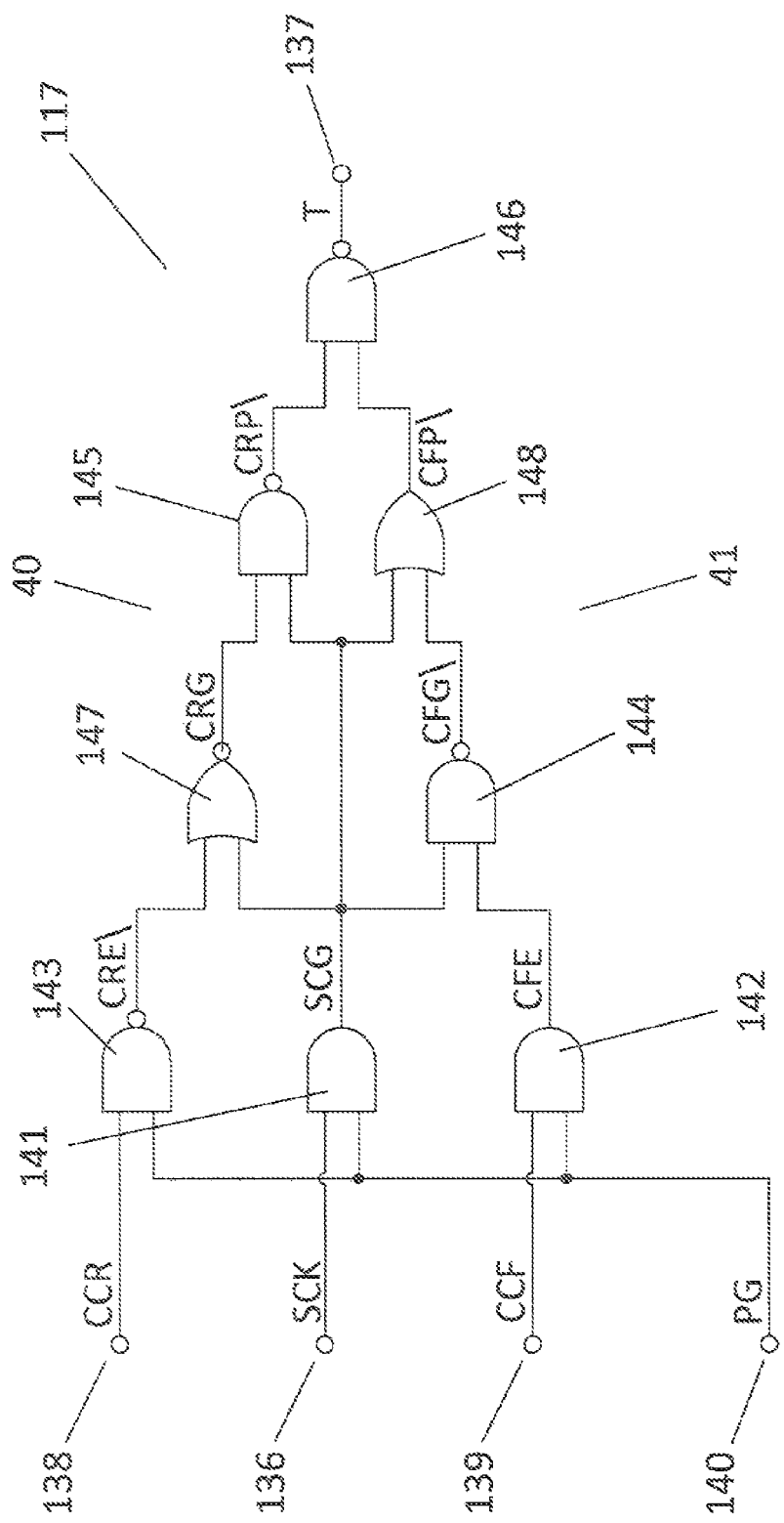
FIG. 15 shows a second embodiment of a pulse generator for the clock gating circuit of FIG. 12.

The second embodiment of the pulse generator 117 shown in FIG. 15 is an improvement over the first embodiment shown in FIG. 13. It comprises two AND-gates 141, 142, four NAND-gates 143, 144, 145, 146, a NOR-gate 147 and an OR-gate 148. Terminals and external signals are named and/or numbered equal to FIG. 13. A first input of the first NAND-gate 143 is connected to receive the rising-edge clock control signal CCR from the rising-edge clock control input 138, and a second input is connected to receive the pulse gate signal PG from the gate input 140. A first input of the first AND-gate 141 is connected to receive the system clock signal SCK from the system clock input 136, and a second input is connected to receive the pulse gate signal PG from the gate input 140. A first input of the second AND-gate 142 is connected to receive the falling-edge clock control signal CCF from the falling-edge clock control input 139, and a second input is connected to receive the pulse gate signal PG from the gate input 140. A first input of the NOR-gate 147 is connected to receive a rising-edge clock enable signal CRE\ from the first NAND-gate 143, and a second input is connected to receive a gated system clock signal SCG from the first AND-gate 141. A first input of the second NAND-gate 144 is connected to receive a falling-edge clock enable signal CFE from the second AND-gate 142, and a second input is connected to receive the gated system clock signal SCG from the first AND-gate 141. A first input of the third NAND-gate 145 is connected to receive a rising-edge gate signal CRG from the NOR-gate 147, and a second input is connected to receive the gated system clock signal SCG from the first AND-gate 141. A first input of the OR-gate 148 is connected to receive a falling-edge gate signal CFG\ from the second NAND-gate 144, and a second input is connected to receive the gated system clock signal SCG from the first AND-gate 141. A first input of the fourth NAND-gate 146 is connected to receive a rising-edge pulse signal CRP\ from the third NAND-gate 145, a second input is connected to receive a falling-edge pulse signal CFP\ from the OR-gate 148, and the output is connected to provide the trigger signal T to the trigger output 137.

Figure 16:
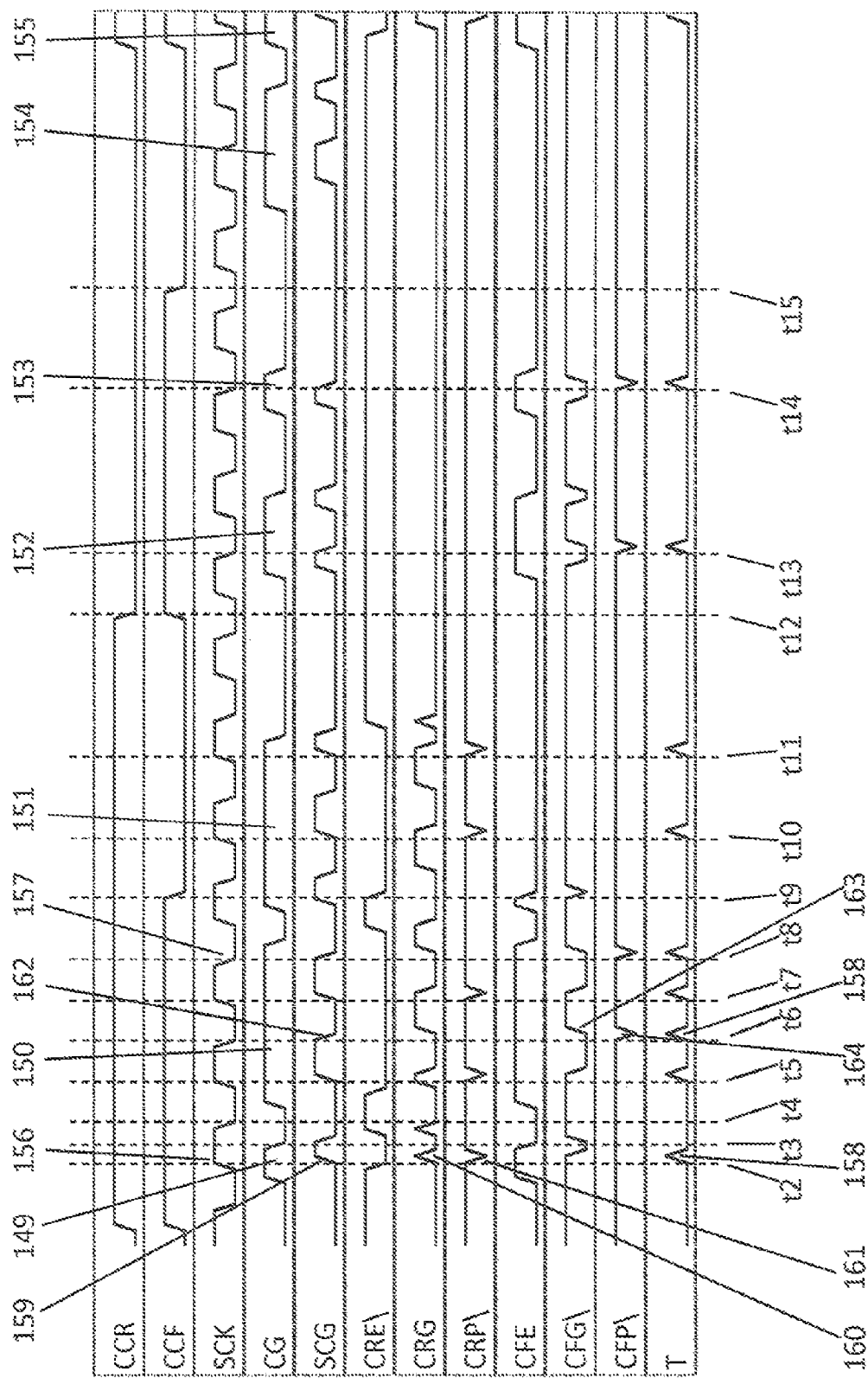
FIG. 16 shows signals illustrating the function of the second embodiment of a pulse generator of FIG. 15.

The function of the second embodiment of the pulse generator 117 is explained with reference to FIG. 15 and the example signals shown in FIG. 16. In FIG. 16, the clock control signals CCR, CCF, the system clock signal SCK and the clock gate signal CG are identical to the corresponding signals shown in FIG. 14. Seen as a blackbox, the second embodiment of the pulse generator 117 functions similar to the first embodiment, thereby providing trigger pulses 158 at substantially the same times. Internally, however, the behaviour of the second embodiment differs from the behaviour of the first embodiment.

When the rising-edge clock control signal CCR is low, the rising-edge clock enable signal CRE\ is forced high, the rising-edge gate signal CRG is forced low and the rising-edge pulse signal CRP\ is forced high, so that the upper branch 40 of the pulse generator 117 is prevented from generating trigger pulses 158 in the trigger signal T. When the falling-edge clock control signal CCF is low, the falling-edge clock enable signal CFE is forced low, the falling-edge gate signal CFG\ is forced high and the falling-edge pulse signal CFP\ is forced high, so that the lower branch 41 of the pulse generator 117 is prevented from generating trigger pulses 158. In these cases, the respective opposite branch 41, 40 may generate trigger pulses 158 by temporarily forcing respectively the falling-edge pulse signal CFP\ or the rising-edge pulse signal CRP\ low. When the clock gate signal CG, and hence the pulse gate signal PG, is low, the rising-edge clock enable signal CRE\ is forced high and the falling-edge clock enable signal CFE is forced low, so that both branches 40, 41 are prevented from generating trigger pulses 158.

The upper branch 40 generates a trigger pulse 158 when a rising edge 156 occurs in the system clock signal SCK while the rising-edge clock control signal CCR and the clock gate signal CG are both high, e.g. at the time t2. Prior to the rising edge 156 in the system clock signal SCK, the high levels of the rising-edge clock control signal CCR and the clock gate signal CG as well as the low level of the system clock signal SCK force the rising-edge clock enable signal CRE\ low, the gated system clock signal SCG low, the rising-edge gate signal CRG high and the rising-edge pulse signal CRP\ high. Since the clock gate signal CG is high, the rising edge 156 in the system clock signal SCK propagates through the first AND-gate 141, thereby causing a rising edge 159 in the gated system clock signal SCG. The rising edge 159 in the gated system clock signal SCG propagates through the NOR-gate 147, thereby causing a falling edge 160 in the rising-edge gate signal CRG. Due to the propagation delay in the NOR-gate 147, the falling edge 160 in the rising-edge gate signal CRG arrives later at the third NAND-gate 145 than the rising edge 159 in the gated system clock signal SCG. The third NAND-gate 145 thus generates a short low pulse 161 in the rising-edge pulse signal CRP\, which causes a trigger pulse 158 in the trigger signal T.

When a falling edge 157 occurs in the system clock signal SCK while the rising-edge clock control signal CCR and the clock gate signal CG are both high, e.g. at the time t6, the falling edge 157 in the system clock signal SCK propagates to the third NAND-gate 145 in a similar way, but since the rising-edge gate signal CRG—due to the previous high level of the gated system clock signal SCG—is now low and does not go high till after the gated system clock signal SCG goes low, the third NAND-gate 145 holds the high level of the rising-edge pulse signal CRP\. The upper branch 40 of the pulse generator 117 thus does not generate a trigger pulse 158 when a falling edge 157 occurs in the system clock signal SCK.

When the clock gate signal CG goes high while the rising-edge clock control signal CCR and the system clock signal SCK are both high, e.g. just before the time t9, the rising-edge clock enable signal CRE\ is forced low and the gated system clock signal SCG is forced high nearly simultaneously. In order to prevent a glitch in the rising-edge gate signal CRG, the propagation delays within the first NAND-gate 143 are dimensioned to be larger than the propagation delays within the first AND-gate 141. It is thus ensured that the gated system clock signal SCG goes high before the rising-edge clock enable signal CRE\ goes low, so that the NOR-gate 147 holds the low level of the rising-edge gate signal CRG, thereby preventing the generation of an undesired trigger pulse 158.

Similarly, when the clock gate signal CG goes low while the rising-edge clock control signal CCR and the system clock signal SCK are both high, e.g. at the time t3, the gated system clock signal SCG is forced low and the rising-edge clock enable signal CRE\ is forced high nearly simultaneously. The propagation delays within the first NAND-gate 143, the first AND-gate 141 and the NOR-gate 147 ensure that the gated system clock signal SCG goes low before the rising-edge clock enable signal CRE\ goes high and thus also before the rising-edge gate signal CRG goes high. The third NAND-gate 145 thus holds the high level of the rising-edge pulse signal CRP\, thereby preventing the generation of an undesired trigger pulse 158.

The lower branch 41 generates a trigger pulse 158 when a falling edge 157 occurs in the system clock signal SCK while the falling-edge clock control signal CCF and the clock gate signal CG are both high, e.g. at the time t6. Prior to the falling edge 157 in the system clock signal SCK, the high levels of the falling-edge clock control signal CCF and the clock gate signal CG as well as the high level of the system clock signal SCK force the falling-edge clock enable signal CFE high, the gated system clock signal SCG high, the falling-edge gate signal CFG\ low and the falling-edge pulse signal CFP\ high. Since the clock gate signal CG is high, the falling edge 157 in the system clock signal SCK propagates through the first AND-gate 141, thereby causing a falling edge 162 in the gated system clock signal SCG. The falling edge 162 in the gated system clock signal SCG propagates through the second NAND-gate 144, thereby causing a rising edge 163 in the falling-edge gate signal CFG\. Due to the propagation delay in the second NAND-gate 144, the rising edge 163 in the falling-edge gate signal CFG\ arrives later at the OR-gate 148 than the falling edge 162 in the gated system clock signal SCG. The OR-gate 148 thus generates a short low pulse 164 in the falling-edge pulse signal CFP\, which causes a trigger pulse 158 in the trigger signal T.

When a rising edge 156 occurs in the system clock signal SCK while the falling-edge clock control signal CCF and the clock gate signal CG are both high, e.g. at the time t2, the rising edge 156 in the system clock signal SCK propagates to the OR-gate 148 in a similar way, but since the falling-edge gate signal CFG\—due to the previous low level of the gated system clock signal SCG—is now high and does not go low till after the gated system clock signal SCG goes high, the OR-gate 148 holds the high level of the falling-edge pulse signal CFP\. The lower branch 41 of the pulse generator 117 thus does not generate a trigger pulse 158 when a rising edge 156 occurs in the system clock signal SCK.

When the clock gate signal CG goes low while the falling-edge clock control signal CCF and the system clock signal SCK are both high, e.g. at the time t3, the falling-edge clock enable signal CFE is forced low, thereby forcing the falling-edge gate signal CFG\ high, and the gated system clock signal SCG is forced low nearly simultaneously. In order to prevent a glitch in the falling-edge pulse signal CFP\, the propagation delays within the first AND-gate 141 are dimensioned to be larger than the combined propagation delays within the second AND-gate 142 and the second NAND-gate 144. It is thus ensured that the falling-edge gate signal CFG\ goes high before the gated system clock signal SCG goes low, so that the OR-gate 148 holds the high level of the falling-edge pulse signal CFP\, thereby preventing the generation of an undesired trigger pulse 158.

Similarly, when the clock gate signal CG goes high while the falling-edge clock control signal CCF and the system clock signal SCK are both high, e.g. just before the time t9, the falling-edge clock enable signal CFE and the gated system clock signal SCG are forced high nearly simultaneously, thereby forcing the falling-edge gate signal CFG\ low. The propagation delays within the second NAND-gate 144 ensure that the gated system clock signal SCG goes high before the falling-edge gate signal CFG\ goes low. The OR-gate 148 thus holds the high level of the falling-edge pulse signal CFP\, thereby preventing the generation of an undesired trigger pulse 158.

In the first embodiment of the pulse generator 117 shown in FIG. 13, the system clock signal SCK is received by four gate inputs, i.e. inputs of the NOR-gate 31, of the first and second NAND-gates 32, 33 as well as of the OR-gate 34. In the second embodiment of the pulse generator 117 shown in FIG. 15, the system clock signal SCK is received by only one gate input, i.e. an input of the first AND-gate 141. The second embodiment of the pulse generator 117 thus loads the external clock generating circuit (not shown) less than the first embodiment of a pulse generator 117. The second embodiment may thus allow for a lower power consumption and the use of a faster system clock signal SCK than the first embodiment, which also applies to a clock gating circuit 116 according to the invention and incorporating the respective pulse generators 117. Since in the second embodiment of the pulse generator 117 the gating of the system clock signal SCK takes place on the input side, i.e. by the first AND-gate 141, less signals are switching during low phases of the clock gate signal CG than in the first embodiment of the pulse generator 117, wherein the gating takes place on the output side, i.e. by the AND-gate 37. This may further reduce the power consumption in the pulse generator 117 and in the clock gating circuit 116.

The flip-flop 118 may be implemented with a level-controlled latch instead of an edge-triggered flip-flop, provided that the duration of the trigger pulses 158 in the trigger signal T is dimensioned to ensure that the storage element 118, 120 toggles the clock signal CK only once for each trigger pulse 158. More specifically, each trigger pulse 158 must terminate before the level change in the clock signal CK caused by the leading edge of the trigger pulse 158 propagates through the inverter 120 to the data input 131 of the latch 118. Otherwise, the feedback through the inverter 120 may cause more than one transition of the clock signal CK for each trigger pulse 158.

In applications wherein the use of DET circuits, such as the ones described above, is not desirable, there is still a need for storage cells with low power consumption and means for facilitating scan testing. The SET storage cell described below fulfils this and other objects.

Figure 17:
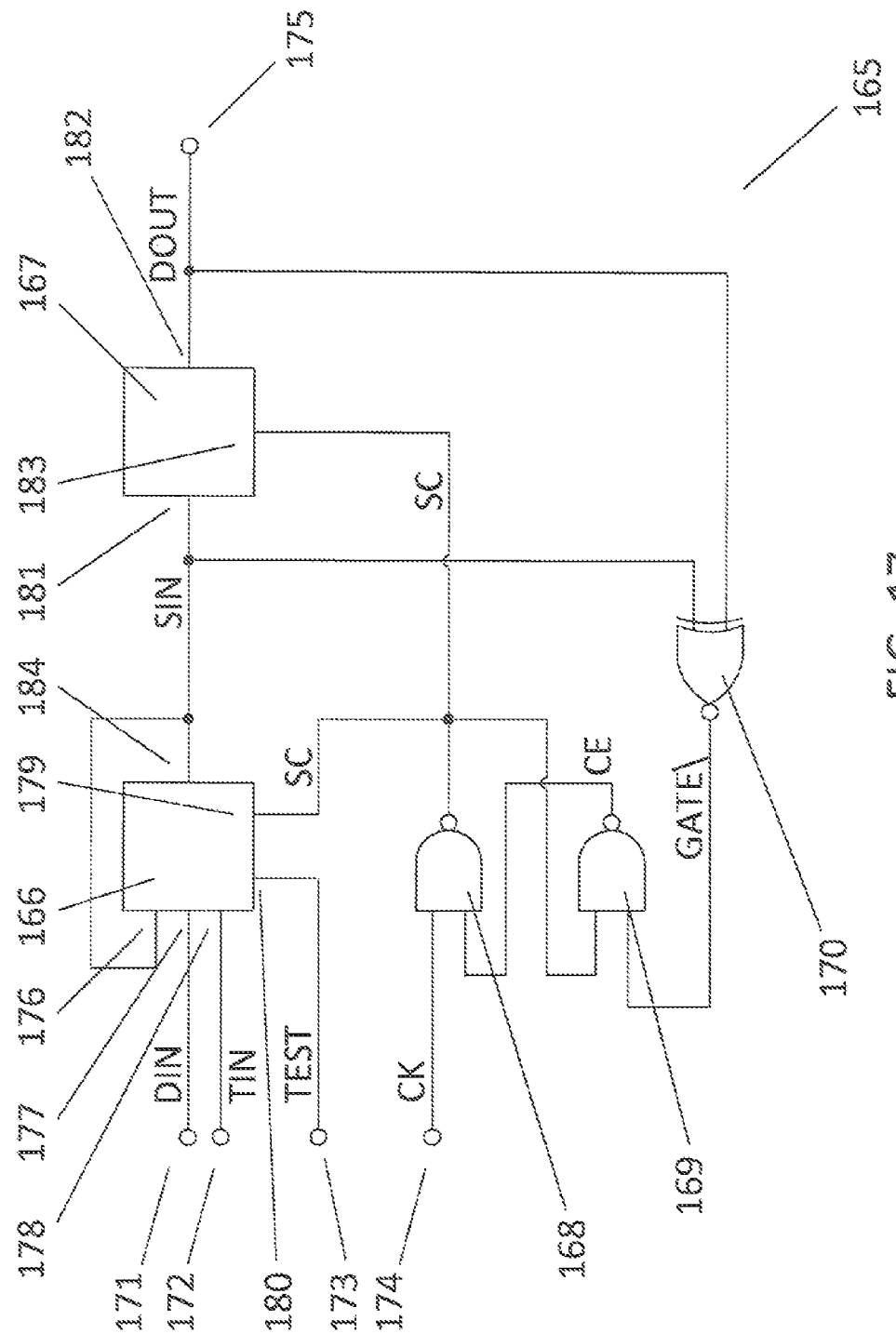
FIG. 17 shows an embodiment of an SET storage cell.

An embodiment of an SET storage cell 165 is shown in FIG. 17. It has a switch 166, a storage element 167, two NAND-gates 168, 169, an inverting XOR-gate 170, a data input terminal 171, a test input terminal 172, a test control terminal 173, a clock terminal 174 and a data output terminal 175. The switch 166 has three inputs 176, 177, 178, a data control input 179, a test control input 180 and an output 184. The switch 166 is adapted to selectively connect one of the inputs 176, 177, 178 to the output 184 in response to signals received on the control inputs 179, 180. The switch 166 comprises an active output driver and may be implemented e.g. as an electronic switch followed by a buffer or as a multiplexer. The storage element 167 is a conventional level-controlled latch with a storage input 181, a storage output 182 and a storage control input 183. The storage element 167 is adapted to be in a data transfer state when a low level is applied to the storage control input 183 and in a data retention state otherwise. In the data transfer state, the level on the storage output 182 follows the level on the storage input 181. In the data retention state, the storage element 167 holds the level of the storage output 182, regardless of the level on the storage input 181. The inverting XOR-gate 170 provides a high signal on its output when the signal levels on the inputs are equal, and provides a low signal otherwise.

The first input 176 of the switch 166 is connected to receive a storage input signal SIN from the output 184 of the switch 166. The second input 177 of the switch 166 is connected to receive a data input signal DIN from the data input terminal 171. The third input 178 of the switch 166 is connected to receive a test input signal TIN from the test input terminal 172. The data control input 179 of the switch 166 is connected to receive a storage control signal SC from the first NAND-gate 168. The test control input 180 of the switch 166 is connected to receive a test control signal TEST from the test control terminal 173. The storage input 181 of the storage element 167 is connected to receive the storage input signal SIN from the output 184 of the switch 166. The storage output 182 of the storage element 167 is connected to provide a data output signal DOUT to the data output terminal 175. The storage control input 183 is connected to receive the storage control signal SC from the first NAND-gate 168. A first input of the first NAND-gate 168 is connected to receive a clock signal CK from the clock terminal 174, and a second input is connected to receive a clock enable signal CE from the second NAND-gate 169. A first input of the second NAND-gate 169 is connected to receive the storage control signal SC from the first NAND-gate 168, and a second input is connected to receive a gate signal GATE\ from the inverting XOR-gate 170. A first input of the inverting XOR-gate 170 is connected to receive the storage input signal SIN from the output 184 of the switch 166, and a second input is connected to receive the data output signal DOUT from the storage output 182 of the storage element 167.

The function of the SET storage cell 165 is explained with reference to FIG. 17 and to the example signals shown in FIG. 18. An external circuit (not shown) supplies the data input signal DIN to the data input terminal 171 and the clock signal CK to the clock terminal 174. The clock signal CK alternates and has rising edges 185 and falling edges 186 as well as high or low phases between consequtive edges 185, 186. The clock signal CK has a duty cycle of about 50 percent. The data input signal DIN changes randomly, but has stable levels during the transitions 185, 186 as well as during the high phases of the clock signal CK.

The switch 166 operates in the following way. When the level on the data control input 179, which equals the level of the storage control signal SC, is low, the switch 166 connects the first input 176 to the output 184, thereby holding the level of the storage input signal SIN by means of the output driver. When the storage control signal SC is high, the switch 166 connects either the second input 177 or the third input 178 to the output 184, depending on the signal received on the test control input and thus on the test control signal TEST. In FIG. 18, it is assumed that a test control signal TEST is applied which causes the switch 166 to connect the second input 177 to the output 184 in this situation. The storage input signal SIN thus follows the data input signal DIN when the storage control signal SC is high. Due to the signal feedback from the output 184 to the first input 176, the function of the switch 166 is similar to that of a conventional level-controlled latch with a built-in multiplexer, which allows switching of the data input between two signal sources.

Figure 18:
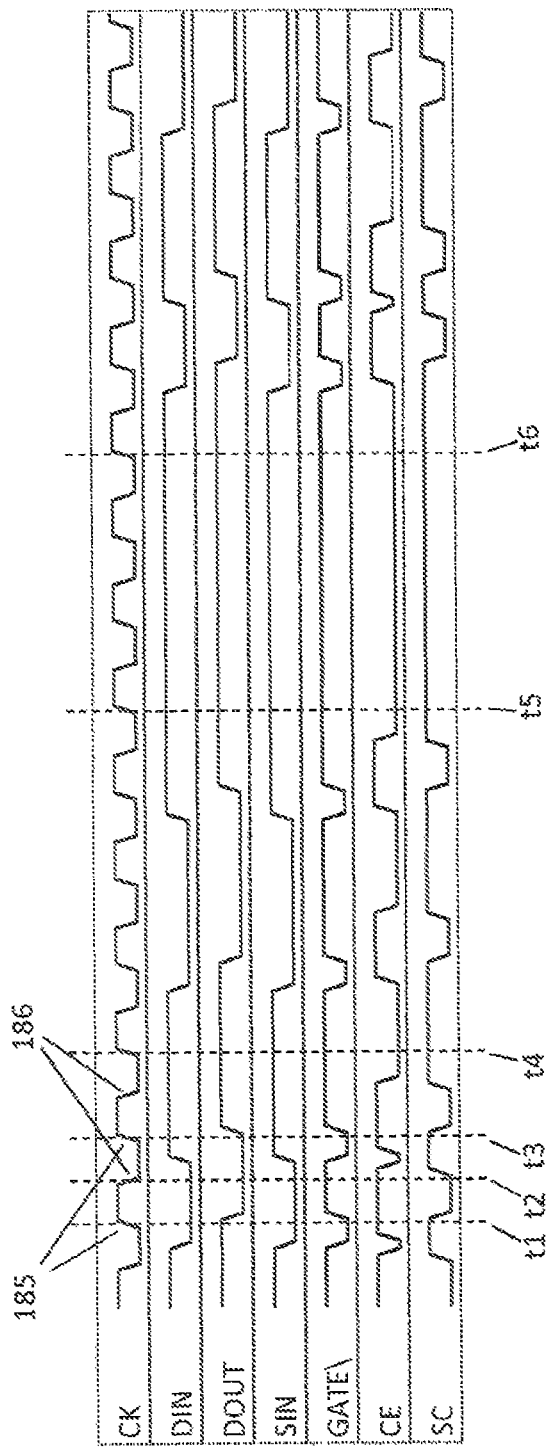
FIG. 18 shows signals illustrating the function of the SET storage cell of FIG. 17.

Immediately before the occurrence of a rising edge 185 in the clock signal CK at the time t1 in FIG. 18, the external circuit has switched the data input signal DIN to a low level. Since the data output signal DOUT is still high, this causes the inverting XOR-gate 170 to switch the gate signal GATE\ low, which forces the clock enable signal CE high. The high phase of the clock signal CK starting at the time t1 causes the first NAND-gate 168 to switch the storage control signal SC low, which causes the switch 166 to hold the low level of the storage control signal SIN and the storage element 167 to go into the data transfer state, thus propagating the low level to the data output signal DOUT. This causes the data input signal DIN and the data output signal DOUT to equal each other, so that the inverting XOR-gate 170 switches the gate signal GATE\ high. The low level of the storage control signal SC, however, causes the second NAND-gate 169 to keep the clock enable signal CE high and eventually the first NAND-gate 168 to keep the storage control signal SC low. The subsequent low phase in the clock signal CK starting at the time t2 forces the storage control signal SC high, which causes the storage element 167 to go into the data retention state and hold the low level of the data output signal DOUT. The high level of the storage control signal SC furthermore causes the switch 166 to connect the second input 177 to the output 184, so that the storage input signal SIN follows the data input signal DIN. This continues until the time t3, where the external circuit has again switched the data input signal DIN and the SET storage cell 165 therefore repeats the action described above, however with inverted levels of the data input signal DIN, the storage input signal SIN and the data output signal DOUT.

At e.g. the times t4, t5 and t6, the levels of the data input signal DIN and the data output signal DOUT equal each other, which forces the gate signal GATE\ high. Since the storage control signal SC is also high, the clock enable signal CE is forced low and the first NAND-gate 168 thus holds the high level of the storage control signal SC, regardless of the level of the clock signal CK. The rising edge 185 occurring at the time t4 therefore does not cause any changes in the signal levels within the SET storage cell 165. The SET storage cell 165 thus does not switch any internal signals when the levels of the data input signal DIN and the data output signal DOUT equal each other. This may reduce the power consumption of the SET storage cell 165. Furthermore, the gating of the clock signal CK takes place at the input side of the SET storage cell 165 and the clock signal CK is only loaded by a single input, i.e. the first input of the first NAND-gate 168. This may reduce the power consumption of the SET storage cell 165 further.

The SET storage cell 165 supports scan testing by being switchable from a normal mode to a test mode by applying a test control signal TEST which causes the switch 166 to connect the third input 178 to the output 184, thus causing the storage input signal SIN to follow the test input signal TIN, when the storage control signal SC is high. The SET storage cell 165 may thus be used in scan testing of the surrounding circuitry as described further above with respect to the DET storage cell 1 shown in FIG. 3.

Scan testing as described further above is both simple to perform and may cover nearly all circuit portions of the SET storage cell 165 and the surrounding circuitry. The steps of the further above described scan test sequence may be performed automatically as part of scan testing in existing test equipment. Furthermore, nearly all circuit portions of the SET storage cell 165 may be tested using the scan test sequence described further above, since all circuit portions are involved in the test. The SET storage cell 165 according to the present invention thus allows extensive testing of itself and supports scan testing.

It should be obvious to the person skilled in the art, that the polarity of any of the described signals and/or the corresponding circuit components may be inverted, e.g in order to improve the cooperation between circuit components or in order to adapt these to inverted logic levels in the connected circuits, without deviating from the spirit and scope of the invention. This applies to any and all of the signals and circuits described above and in the figures. For instance, the storage element 6 comprised in the storage cell 1 according to the present invention may be implemented as an inverting storage element, meaning that the data output signal DOUT equals the negation of the data input signal DIN when the storage element 6 is in the data transfer state. In this case, the condition for terminating and the condition for disabling initiation of control pulses 15, 16 in the storage control signal SC must obviously be reversed to the level of the data output signal DOUT being different from the level of the data input signal DIN.

Furthermore, signals may be received directly from the mentioned terminals or indirectly via intervening passive or active circuits, such as buffers, inverters, logic gates, transistors etc., without deviating from the spirit and scope of the invention.

The invention is defined by the features of the independent claim(s). Preferred embodiments are defined in the dependent claims. Any reference numerals in the claims are intended to be non-limiting for their scope.

Some preferred embodiments have been shown in the foregoing, but it should be stressed that the invention is not limited to these, but may be embodied in other ways within the subject-matter defined in the following claims. For example, the features of the described embodiments may be combined arbitrarily.

The invention claimed is:

1. A modified NOR-gate comprising;
    first, second, third and fourth switch elements, a hold circuit, a clock input terminal, an enable input terminal, an output terminal, a positive supply terminal and a negative supply terminal, each switch element comprising a drain, a source and a gate, and configured to be switched between being in a closed state and being in an open state in response to a control voltage between the gate and the drain or between the gate and the source,
    the switch elements being connected in series between a positive supply terminal and a negative supply terminal with the drain of the first switch element being connected to the positive supply terminal, the drain of the second switch element being connected to the source of the first switch element, the drain of the third switch element being connected to the source of the second switch element and to the output terminal, the drain of the fourth switch element being connected to the source of the third switch element and the source of the fourth switch element being connected to the negative supply terminal, and wherein
    the gate of the first switch element being connected to the clock input terminal, the gates of the second, third and fourth switch elements being connected to the enable input terminal, and
    the first and second switch elements are conventional P-channel field-effect transistors, each of which is in the closed state, when there is a sufficiently large, negative voltage between the gate and the drain, and in the open state otherwise.

2. A modified NOR-gate according to claim 1 wherein the third and fourth switch elements are conventional N-channel field-effect transistors, each of which is in the closed state, when there is a sufficiently large, positive voltage between the gate and the source, and in the open state otherwise.

3. A modified NOR-gate according to claim 1 wherein the hold circuit is connected to the output terminal and is dimensioned to hold the level on the output terminal when at least one of the first and second switch elements and at least one of the two remaining switch elements are in the open state, and to allow the switch elements to control the level on the output terminal otherwise.

4. A modified NOR-gate according to claim 1 configured to function as a conventional NOR-gate, except that when the inputs enter a state wherein the enable signal is low and the clock signal is high, in which case it goes into a hold state wherein it holds the level of the output signal.

5. A modified NOR-gate according to claim 1 configured to provide a NOR-function, in which the effect of a rising edge in the clock signal GCK is delayed until the enable signal goes high.

6. A modified NOR-gate according to claim 1 wherein each of the switch elements are configured to have a low resistance to currents flowing from the drain to the source in the closed state, and to have a high resistance to such currents in the open state.

7. A modified NAND-gate, comprising:
    first, second, third and fourth switch elements, a hold circuit, a clock input terminal, an enable input terminal, an output terminal, a positive supply terminal and a negative supply terminal, each switch element comprising a drain, a source and a gate, and configured to be switched between being in a closed state and being in an open state in response to a control voltage between the gate and the drain or between the gate and the source, the switch elements being connected in series between a positive supply terminal and a negative supply terminal with the drain of the first switch element being connected to the positive supply terminal, the drain of the second switch element being connected to the source of the first switch element, the drain of the third switch element being connected to the source of the second switch element and to the output terminal, the drain of the fourth switch element being connected to the source of the third switch element and the source of the fourth switch element being connected to the negative supply terminal, and wherein the gate of the fourth switch element is connected to the clock input terminal, and the gates of the first, second, and third switch elements are connected to the enable input terminal, and the first and second switch elements are conventional P-channel field-effect transistors, each of which is in the closed state, when there is a sufficiently large, negative voltage between the gate and the drain, and in the open state otherwise.

8. A modified NAND-gate according to claim 7 wherein the third and fourth switch elements are conventional N-channel field-effect transistors, each of which is in the closed state, when there is a sufficiently large, positive voltage between the gate and the source, and in the open state otherwise.

9. A modified NAND-gate according to claim 7 wherein the hold circuit is connected to the output terminal and is dimensioned to hold the level on the output terminal when at least one of the first and second switch elements and at least one of the two remaining switch elements are in the open state, and to allow the switch elements to control the level on the output terminal otherwise.

10. A modified NAND-gate according to claim 7 configured to function as a conventional NAND-gate, except that when the inputs enter a state wherein the enable signal is high and the clock signal is low, it goes into a hold state wherein it holds the level of the output signal.

11. A modified NAND-gate according to claim 7 configured to provide a NAND-function, in which the effect of a falling edge in the clock signal is delayed until the enable signal FE goes low.

12. A modified NAND-gate according to claim 7 wherein each of the switch elements are configured to have a low resistance to currents flowing from the drain to the source in the closed state, and to have a high resistance to such currents in the open state.

* * * * *